United States Patent
Chisaka et al.

(10) Patent No.: US 11,274,245 B2
(45) Date of Patent: Mar. 15, 2022

(54) CURABLE COMPOSITION, FILM, OPTICAL FILM, LIGHT-EMITTING DISPLAY ELEMENT PANEL, AND LIGHT-EMITTING DISPLAY

(71) Applicant: TOKYO OHKA KOGYO CO., LTD., Kanagawa (JP)

(72) Inventors: Hiroki Chisaka, Kanagawa (JP); Kunihiro Noda, Kanagawa (JP); Dai Shiota, Kanagawa (JP)

(73) Assignee: TOKYO OHKA KOGYO CO., LTD., Kanagawa (JP)

( * ) Notice: Subject to any disclaimer, the term of this patent is extended or adjusted under 35 U.S.C. 154(b) by 1 day.

(21) Appl. No.: 16/213,040

(22) Filed: Dec. 7, 2018

(65) Prior Publication Data
US 2019/0177608 A1   Jun. 13, 2019

(30) Foreign Application Priority Data
Dec. 11, 2017   (JP) .............................. JP2017-237261

(51) Int. Cl.
| | | |
|---|---|---|
| *C09K 11/02* | (2006.01) | |
| *C09K 11/56* | (2006.01) | |
| *C09K 11/70* | (2006.01) | |
| *C09K 11/88* | (2006.01) | |
| *C08J 5/18* | (2006.01) | |
| *F21V 8/00* | (2006.01) | |
| *G02F 1/13357* | (2006.01) | |

(52) U.S. Cl.
CPC ................ *C09K 11/02* (2013.01); *C08J 5/18* (2013.01); *C09K 11/565* (2013.01); *C09K 11/70* (2013.01); *C09K 11/883* (2013.01); *C08J 2363/00* (2013.01); *G02B 6/005* (2013.01); *G02F 1/133617* (2013.01)

(58) Field of Classification Search
CPC ....... C09K 11/02; C09K 11/70; C09K 11/565; C09K 11/883; C08J 5/18; C08J 2363/00; G02F 1/133617
See application file for complete search history.

(56) References Cited

U.S. PATENT DOCUMENTS

| | | | | |
|---|---|---|---|---|
| 3,247,283 A | * | 4/1966 | McGary, Jr. ....... | C08G 59/4284 525/524 |
| 2006/0169971 A1 | | 8/2006 | Cho et al. | |
| 2008/0084706 A1 | | 4/2008 | Roshan et al. | |
| 2010/0123155 A1 | * | 5/2010 | Pickett .................. | H01L 33/005 257/98 |
| 2012/0295199 A1 | * | 11/2012 | Takeyama ............... | C08L 63/00 430/280.1 |
| 2015/0171281 A1 | * | 6/2015 | Nakabayashi ........ | H01L 33/486 257/98 |
| 2017/0250322 A1 | * | 8/2017 | Wang ..................... | C09K 11/02 |
| 2017/0305848 A1 | * | 10/2017 | Shiota ..................... | C09K 3/00 |

FOREIGN PATENT DOCUMENTS

| | | | | |
|---|---|---|---|---|
| CN | 107446577 A | * | 12/2017 | ............. C09K 11/02 |
| EP | 3434709 A1 | * | 1/2019 | ............. C08G 59/24 |
| JP | 2006-216560 A | | 8/2006 | |
| JP | 2008-112154 A | | 5/2008 | |
| KR | 10-2016-0004524 A | | 1/2016 | |

\* cited by examiner

*Primary Examiner* — Bijan Ahvazi
(74) *Attorney, Agent, or Firm* — Pearne & Gordon LLP

(57) ABSTRACT

To provide a curable composition which can easily form an optical film with good fluorescence efficiency and includes quantum dots (B), a film made of a cured product of the curable composition, an optical film for a light-emitting display element made of the film, a light-emitting display element panel including the optical film, and a light-emitting display equipped with the light-emitting display element panel. A film is formed by curing a curable composition which includes an epoxy compound (A) having two or more epoxy groups and including a cyclic structure other than an oxirane ring, quantum dots (B), and an acid generator (C).

11 Claims, No Drawings

CURABLE COMPOSITION, FILM, OPTICAL FILM, LIGHT-EMITTING DISPLAY ELEMENT PANEL, AND LIGHT-EMITTING DISPLAY

This application is based on and claims the benefit of priority from Japanese Patent Application No. 2017-237261, filed on 11 Dec. 2017, the content of which is incorporated herein by reference.

BACKGROUND OF THE INVENTION

Field of the Invention

The present invention relates to a curable composition including quantum dots, a film made of a cured product of the curable composition, an optical film for a light-emitting display element made of the film, a light-emitting display element panel including the optical film, a light-emitting display equipped with the light-emitting display element panel.

Related Art

An extremely small grain (dot) formed to confine electrons has been conventionally called a quantum dot, and the application thereof in a variety of fields has been investigated. Here, the size of one quantum dot is from several nanometers to tens of nanometers in diameter and is formed from about ten thousands of atoms.

Such quantum dot can change light-emitting fluorescent color (emission wavelength) (wavelength conversion) by changing the sizes thereof (changing bandgaps). Because of this, it has been diligently investigated that quantum dots are applied to a display element as a wavelength conversion material in recent years (see Patent Documents 1 and 2).

In addition, it has been investigated that an optical film including quantum dots is applied to various optical light-emitting elements and display elements. For example, it has been proposed that a quantum dot sheet including quantum dots dispersed in a matrix made of various polymeric materials is used as an optical film (see Patent Document 3). For example, when light rays emitted from a light source are allowed to pass through an optical film including quantum dots in elements to show an image using light emission of a light source such as a liquid crystal display element and an organic EL display element, green light and red light, which have high color purity, can be extracted by wavelength conversion. Because of this, the range of hue reproduction can be enlarged by applying an optical film including quantum dots to various display elements.

Patent Document 1: Japanese Unexamined Patent Application, Publication No. 2006-216560
Patent Document 2: Japanese Unexamined Patent Application, Publication No. 2008-112154
Patent Document 3: Korean Patent Application No. 10-2016-0004524

SUMMARY OF THE INVENTION

In fact, however, an optical film with good fluorescence efficiency cannot be necessarily produced by simply combining quantum dots with a resin material. The reason has not been clear; however, it is thought that this is because it is difficult to produce an optical film with cohesion between quantum dots inhibited and quantum dots stably dispersed. The quantum dots often have a large specific surface area, a surface atom which can be a coordinate site, and high reactivity. Therefore, fine particles of quantum dots very easily cohere.

An object of the present invention is to provide a curable composition which can easily form an optical film with good fluorescence efficiency and includes quantum dots (B), a film made of a cured product of the curable composition, an optical film for a light-emitting display element made of the film, a light-emitting display element panel including the optical film, and a light-emitting display equipped with the light-emitting display element panel.

The present inventors found that the above problem could be solved by producing a film by curing a curable composition, which includes an epoxy compound (A) having two or more epoxy groups and including a cyclic structure other than an oxirane ring, quantum dots (B), and an acid generator (C), thereby completing the present invention.

The first aspect of the present invention is a curable composition, including an epoxy compound (A), quantum dots (B) and an acid generator (C),
wherein the epoxy compound (A) has two or more epoxy groups and includes a cyclic structure other than an oxirane ring.

The second aspect of the present invention is a film made of a cured product of the curable composition according to the first aspect.

The third aspect of the present invention is an optical film for a light-emitting display element, made of the film according to the second aspect.

The fourth aspect of the present invention is a light-emitting display element panel including the optical film for a light-emitting display element according to the third aspect.

The fifth aspect of the present invention is a light-emitting display, equipped with the light-emitting display element panel according to the fourth aspect.

According to the present invention, it is possible to provide a curable composition which can easily form an optical film with good fluorescence efficiency and includes quantum dots (B), a film made of a cured product of the curable composition, an optical film for a light-emitting display element made of the film, a light-emitting display element panel including the optical film, and a light-emitting display equipped with the light-emitting display element panel.

DETAILED DESCRIPTION OF THE INVENTION

<<Curable Composition>>

The curable composition includes an epoxy compound (A), quantum dots (B), and an acid generator (C). The epoxy compound (A) has two or more epoxy groups and includes a cyclic structure other than an oxirane ring. A cured film with good fluorescence efficiency can be easily formed by using an epoxy compound (A) fulfilling the above requirements and quantum dots (B) in combination in the above curable composition. In addition, a cured film can be formed without a decrease in fluorescence efficiency by curing an epoxy compound (A) using an acid generator (C). The essential or optional components included in the curable compound will now be described.

<Epoxy compound (A)>

The curable composition includes an epoxy compound (A) as a curable component. The epoxy compound (A) has two or more epoxy groups and includes a cyclic structure other than an oxirane ring. A cured product, which includes quantum dots (B) in a well dispersed state and has good fluorescence efficiency, can be formed by using an epoxy compound having such structure.

In addition to the epoxy compound (A), the curable composition may include other curable components such as e.g. an epoxy compound not corresponding to the epoxy compound including a cyclic structure other than an oxirane ring, and a compound having an oxetanyl group. It is preferred that the curable composition include only the epoxy compound (A) as a curable component from the viewpoint of particularly easily forming a cured product with good fluorescence efficiency.

The cyclic structure included in the epoxy compound is not particularly limited. The cyclic structure can be a cyclic structure including carbon as a ring-forming element such as a hydrocarbon ring structure or a heterocyclic ring structure, or can be a cyclic structure not including carbon as a ring-forming element such as a cyclic siloxane structure. Examples of heteroatoms which can be included in the heterocyclic ring structure include a nitrogen atom, an oxygen atom, a sulfur atom, a selenium atom, a silicon atom and the like. The cyclic structure can be a monocyclic structure or a polycyclic structure. The cyclic structure including carbon as a ring-forming element can be an aromatic ring structure, or an aliphatic ring structure, or a polycyclic structure in which an aromatic ring and an aliphatic ring are condensed.

Examples of rings to give the aromatic ring structure or the ring structure including an aromatic ring include a benzene ring, a naphthalene ring, an anthracene ring, a phenanthrene ring, a tetralin ring, an acenaphthene ring and a fluorene ring, and the like. Examples of rings to give the aliphatic ring structure include a monocycloalkane ring, a bicycloalkane ring, a tricycloalkane ring, a tetracycloalkane ring, and the like. Specific examples thereof include monocycloalkane rings such as a cyclopentane ring, a cyclohexane ring, a cycloheptane ring and a cyclooctane ring, an adamantane ring, a norbornane ring, an isobornane ring, a tricyclodecane ring and a tetracyclododecane ring.

Examples of epoxy compounds which can be used as the epoxy compound (A) and are widely used include bifunctional epoxy resins such as bisphenol A epoxy resin, bisphenol F epoxy resin, bisphenol S epoxy resin, bisphenol AD epoxy resin, naphthalene epoxy resin and biphenyl epoxy resin; epoxy group-containing fluorene compounds such as 9,9-bis[4-(glycidyloxy)phenyl]-9H-fluorene, 9,9-bis [4-[2-(glycidyloxy)ethoxy]phenyl]-9H-fluorene, 9,9-bis[4-[2-(glycidyloxy)ethyl]phenyl]-9H-fluorene, 9,9-bis[4-(glycidyloxy)-3-methylphenyl]-9H-fluorene, 9,9-bis[4-(glycidyloxy)-3,5-dimethylphenyl]-9H-fluorene and 9,9-bis (6-glycidyloxynaphthalen-2-yl)-9H-fluorene; glycidylamine epoxy resins such as tetraglycidylaminodiphenylmethane, triglycidyl-p-aminophenol, tetraglycidyl methaxylylene diamine and tetraglycidyl bisaminomethylcyclohexane; trifunctional epoxy resins such as phloroglycinol triglycidylether, trihydroxybiphenyl triglycidylether, trihydroxyphenylmethane triglycidylether, 2-[4-(2,3-epoxypropoxy)phenyl]-2-[4-[1,1-bis[4-(2,3-epoxypropoxy)phenyl]ethyl]phenyl] propane and 1,3-bis[4-[1-[4-(2,3-epoxypropoxy)phenyl]-1-[4-[1-[4-(2,3-epoxypropoxy)phenyl]-1-methylethyl]phenyl] ethyl]phenoxy]-2-propanol; tetrafunctional epoxy resins such as tetrahydroxyphenylethane tetraglycidylether, tetraglycidylbenzophenone, bisresorcinol tetraglycidylether and tetraglycidoxybiphenyl, and a 1,2-epoxy-4-(2-oxiranyl) cyclohexane adduct of 2,2-bis(hydroxymethyl)-1-butanol. The 1,2-epoxy-4-(2-oxiranyl)cyclohexane adduct of 2,2-bis (hydroxymethyl)-1-butanol is commercially available as EHPE-3150 (manufactured by Daicel Corporation).

In addition, an oligomer or polymer type polyfunctional epoxy compound can be preferably used as the epoxy compound (A). Typical examples thereof include a phenol novolac epoxy compound, a brominated phenol novolac epoxy compound, an ortho-cresol novolac epoxy compound, a xylenol novolac epoxy compound, a naphthol novolac epoxy compound, a bisphenol A novolac epoxy compound, a bisphenol AD novolac epoxy compound, an epoxylated product of dicyclopentadiene phenol resin, an epoxylated product of naphthalene phenol resin, and the like.

In addition, a compound represented by the following formula (A1) is also given as a preferred example of the oligomer or polymer type polyfunctional epoxy compounds.

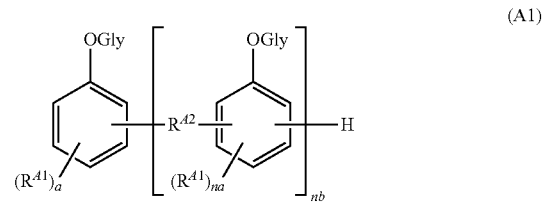

(A1)

In the formula (A1), OGly is a glycidyloxy group, $R^{A1}$ is a halogen atom or a monovalent group having 1 or more and 8 or less carbon atoms, na is an integer of 0 or more and 4 or less, nb is the number of repeated units in the brackets, adjacent two $R^{A1}$ on the benzene ring may be bonded to each other to form a ring when a is an integer of 2 or more, $R^{A2}$ is a divalent aliphatic cyclic group or a group represented by the following formula (A1-1):

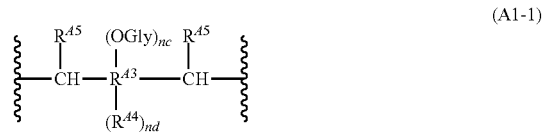

(A1-1)

in the formula (A1-1), OGly is a glycidyloxy group, $R^{A3}$ is an aromatic hydrocarbon group, $R^{A4}$ is a halogen atom or an alkyl group having 1 or more and 4 or less carbon atoms, nc is 0 or 1, nd is an integer of 0 or more and 8 or less, $R^{A5}$ is a hydrogen atom or a group represented by the following formula (A1-2):

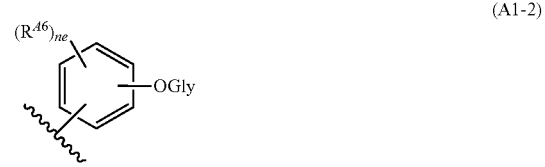

(A1-2)

in the formula (A1-2), OGly is a glycidyloxy group, $R^{A6}$ is a halogen atom, an alkyl group having 1 or more and 4 or less carbon atoms or a phenyl group, and ne is an integer of 0 or more and 4 or less.

The epoxy compound represented by the above formula (A1) preferably has an average molecular weight of 800 or more. A cured product with good water resistance and strength is easily formed by using a compound having such average molecular weight as the epoxy compound represented by the formula (A1). The average molecular weight of the epoxy compound represented by the formula (A1) is preferably 1000 or more, more preferably 1200 or more, and particularly preferably 1500 or more. In addition, the average molecular weight of the epoxy compound represented by the formula (A1) is preferably 50000 or less and more preferably 20000 or less.

In the formula (A1), $R^{41}$ is a halogen atom or a monovalent group having 1 or more and 8 or less carbon atoms. Specific examples of the monovalent group having 1 or more and 8 or less carbon atoms include an alkyl group, an alkoxy group, a phenoxy group, an aliphatic acyl group, an aliphatic acyloxy group, a benzoyl group, a benzyl group, a phenethyl group and an unsaturated aliphatic hydrocarbon group. The alkyl group, alkoxy group, aliphatic acyl group, aliphatic acyloxy group and unsaturated aliphatic hydrocarbon group can be liner or branched.

Suitable examples of the halogen atom as $R^{41}$ include a fluorine atom, a chlorine atom, a bromine atom and an iodine atom. Suitable examples of the alkyl group as $R^{41}$ are preferably a methyl group, an ethyl group, an n-propyl group, an isopropyl group, an n-butyl group, an isobutyl group, a sec-butyl group and a tert-butyl group, and more preferably a methyl group and an ethyl group.

When $R^{41}$ is a monovalent group having 1 or more and 8 or less carbon atoms, the monovalent group is preferably an alkyl group and an alkoxy group. Specific examples of the alkyl group include a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, an n-octyl group and a 2-ethylhexyl group. Specific examples of the alkoxy group include a methoxy group, an ethoxy group, an n-propyloxy group, an isopropyloxy group, an n-butyloxy group, an isobutyloxy group, a sec-butyloxy group, a tert-butyloxy group, an n-pentyloxy group, an n-hexyloxy group, an n-heptyloxy group, an n-octyloxy group and a 2-ethylhexyloxy group.

When na is an integer of 2 or more and 4 or less, adjacent two $R^{41}$ on the benzene ring of a plurality of $R^{41}$ may be bonded to each other to form a ring. The ring formed by bonding two $R^{41}$ can be an aromatic ring or an aliphatic ring, or can be a hydrocarbon ring or a heterocyclic ring. When the ring formed by bonding two $R^{41}$ is a heterocyclic ring, examples of heteroatoms included in the ring include N, O, S and Se, and the like. Suitable examples of the group formed together with a benzene ring by bonding two $R^{41}$ include a naphthalene ring and a tetralin ring.

In the formula (A1), the divalent aliphatic cyclic group as $R^{42}$ is not particularly limited, and can be a polycyclic group of two or more monocyclic groups. It should be noted that the divalent aliphatic cyclic group does not commonly include an epoxy group in the structure, and it is preferred that an epoxy group not be included. Specific examples of the divalent aliphatic cyclic group are a group in which two hydrogen atoms are removed from monocycloalkane, or polycycloalkane such as bicycloalkane, tricycloalkane or tetracycloalkane, and the like. More specific examples thereof include a group in which two hydrogen atoms are removed from monocycloalkane such as cyclopentane or cyclohexane, or polycycloalkane such as adamantane, norbornane, isobornane, tricyclodecane or tetracyclododecane, and the like. The number of carbon atoms in the divalent aliphatic cyclic group is preferably 3 or more and 50 or less, more preferably 3 or more and 30 or less, and particularly preferably 3 or more and 20 or less. The number is most preferably 3 or more and 15 or less.

Specific examples of the divalent aliphatic cyclic group as $R^{42}$ include groups shown below.

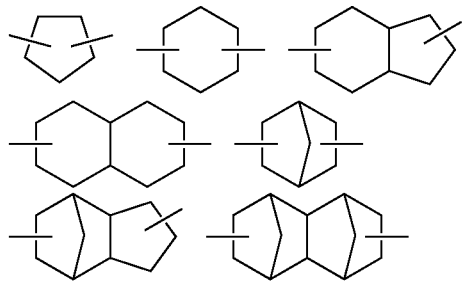

$R^{43}$ is an aromatic hydrocarbon group. The number of valences in the aromatic hydrocarbon group as $R^{43}$ is 2+nc+nd. The aromatic hydrocarbon group is not particularly limited. An aromatic hydrocarbon ring forming the aromatic hydrocarbon group is typically a six-membered aromatic hydrocarbon ring (benzene ring) or a ring in which two or more benzene rings are condensed with each other or bonded through a single bond. Specific suitable examples of the aromatic hydrocarbon ring forming the aromatic hydrocarbon group are benzene, naphthalene, anthracene, phenanthrene, biphenyl and terphenyl. Groups obtained by removing the 2+nc+nd number of hydrogen atoms from these aromatic hydrocarbon rings are suitable for the aromatic hydrocarbon group as $R^{43}$.

In the group represented by the formula (A1-1), nc is 0 or 1. That is, a glycidyloxy group may not be bonded to $R^{43}$, which is an aromatic hydrocarbon group, or one glycidyloxy group may be bonded thereto.

In the group represented by the formula (A1-1), $R^{44}$ is a halogen atom or an alkyl group having 1 or more and 4 or less carbon atoms, and d is an integer of 0 or more and 8 or less. That is, $R^{44}$ is a substituent other than the glycidyloxy group on $R^{43}$, which is an aromatic hydrocarbon group, and the number of substituents on $R^{43}$ is 0 or more and 8 or less. nd is preferably an integer of 0 or more and 4 or less, more preferably an integer of 0 or more and 2 or less, and particularly preferably 0 or 1. Suitable examples of the halogen atom as $R^{44}$ include a fluorine atom, a chlorine atom, a bromine atom and an iodine atom. Suitable examples of the alkyl group as $R^{44}$ are preferably a methyl group, an ethyl group, an n-propyl group, an isopropyl group, an n-butyl group, an isobutyl group, a sec-butyl group and a tert-butyl group, and more preferably a methyl group and an ethyl group.

In the group represented by the formula (A1-1), $R^{45}$ is a hydrogen atom or a group represented by the above-described formula (A1-2). $R^{46}$ in the formula (A1-2) is a halogen atom, an alkyl group having 1 or more and 4 or less carbon atoms, or a phenyl group. Specific examples of the halogen atom and the alkyl group having 1 or more and 4 or less carbon atoms are the same as those of $R^{44}$.

In the epoxy compound represented by the formula (A1) described above, it is preferred that $R^{42}$ be a divalent aliphatic cyclic group or a divalent group represented by the above-described formula (A1-1) in which nc is 0 and $R^{45}$ is a hydrogen atom. In this case, because a proper distance exists between a plurality of epoxy groups included in the epoxy compound represented by the formula (A1), a cured product with better water resistance is easily formed.

The epoxy compound represented by the formula (A1) can be acquired as a commercial product. Specific examples of the commercial product include NC-series and XD-series manufactured by Nippon Kayaku Co., Ltd. and the like. In addition, equivalent products having a specific structure can be acquired from DIC Corporation and Showa Denko K.K.

Suitable examples of chemical structures of the epoxy compound represented by the formula (A1) are shown below. In the following formulae, OGly represents a glycidyloxy group, and p represents the number of repeated units in brackets.

hexylmethyl-3',4'-epoxycyclohexane carboxylate, β-methyl-δ-valerolactone-modified 3,4-epoxycyclohexylmethyl-3',4'-epoxycyclohexane carboxylate, methylenebis(3,4-epoxycyclohexane), di(3,4-epoxycyclohexylmethyl)ether of ethylene glycol, ethylenebis(3,4-epoxycyclohexane carboxylate), a polyfunctional epoxy compound having a tricyclodecene oxide group, and compounds represented by the following formulae (a1-1) to (a1-5). These alicyclic epoxy compounds can be used individually or two or more alicyclic epoxy compounds can be used in combination.

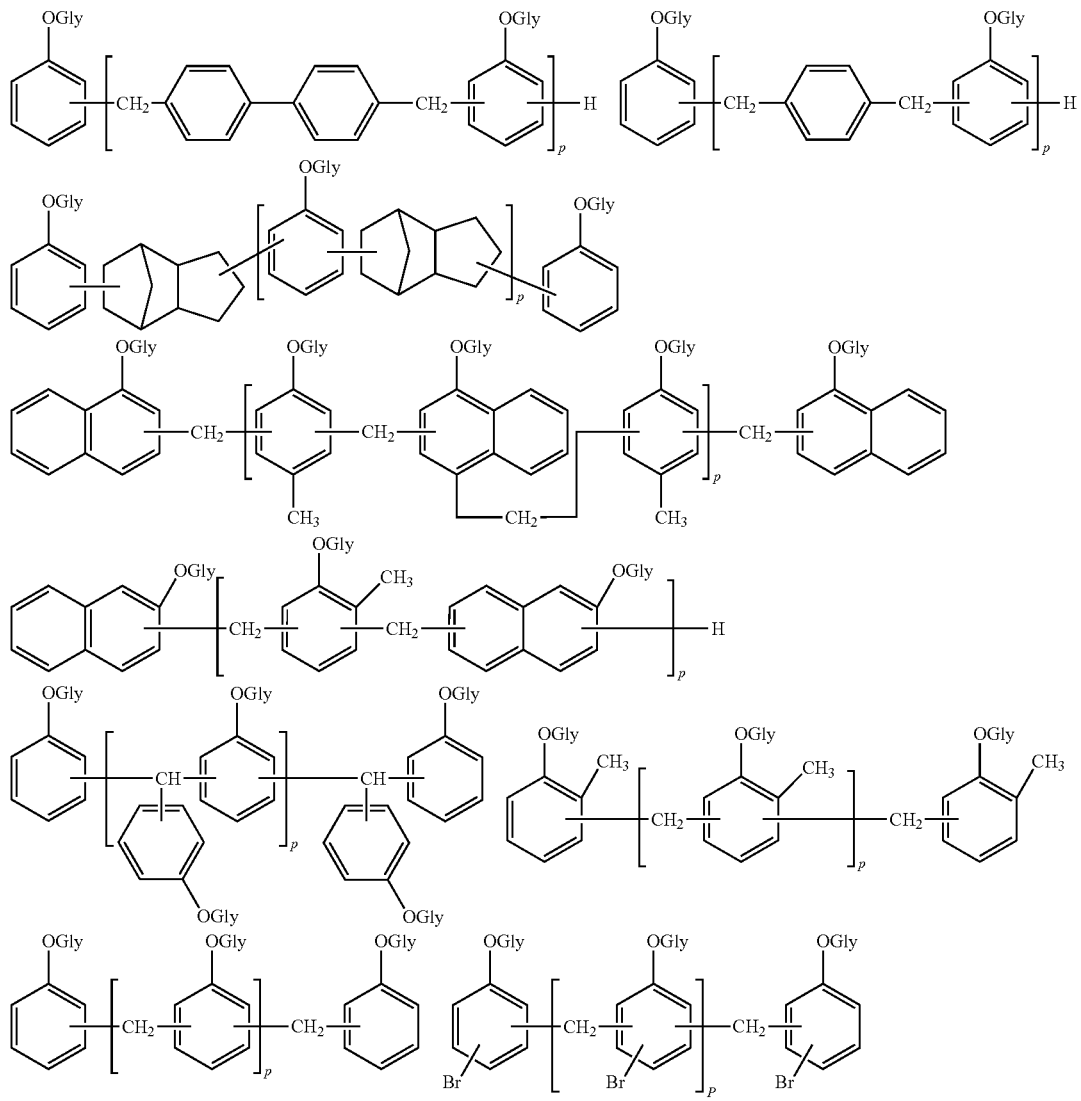

Other examples of suitable epoxy compounds (A) include a polyfunctional alicyclic epoxy compound having an alicyclic epoxy group. Specific examples of the alicyclic epoxy compound include 2-(3,4-epoxycyclohexyl-5,5-spiro-3,4-epoxy)cyclohexane-meta-dioxane, bis(3,4-epoxycyclohexylmethyl)adipate, bis(3,4-epoxy-6-methylcyclohexylmethyl)adipate, 3,4-epoxy-6-methylcyclohexyl-3',4'-epoxy-6'-methylcyclohexane carboxylate, ε-caprolactone-modified 3,4-epoxycyclohexylmethyl-3',4'-epoxycyclohexane carboxylate, trimethylcaprolactone-modified 3,4-epoxycyclo-

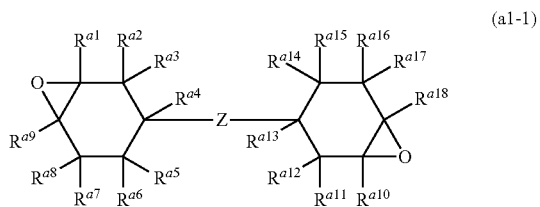

In the formula (a1-1), Z represents a single bond or a linking group (a divalent group having one or more atoms). $R^{a1}$ to $R^{a18}$ are each independently a group selected from the group consisting of a hydrogen atom, a halogen atom and an organic group.

Examples of the linking group Z can include a divalent group selected form the group consisting of a divalent hydrocarbon group, —O—, —O—CO—, —S—, —SO—, —SO$_2$—, —CBr$_2$—, —C(CBr$_3$)$_2$—, —C(CF$_3$)$_2$— and —R$^{a19}$—O—CO—, and a group formed by bonding a plural of these divalent groups, and the like.

Examples of the divalent hydrocarbon group as a linking group Z can include a linear or branched alkylene group having 1 or more and 18 or less carbon atoms, and a divalent alicyclic hydrocarbon group, and the like. Examples of the linear or branched alkylene group having 1 or more and 18 or less carbon atoms can include a methylene group, a methylmethylene group, a dimethylmethylene group, a dimethylene group, a trimethylene group, and the like. Examples of the above divalent alicyclic hydrocarbon group can include cycloalkylene groups (including cycloalkylidene groups) such as a 1,2-cyclopentylene group, a 1,3-cyclopentylene group, a cyclopentylidene group, a 1,2-cyclohexylene group, a 1,3-cyclohexylene group, a 1,4-cyclohexylene group and cyclohexylidene, and the like.

$R^{a19}$ is an alkylene group having 1 or more and 8 or less carbon atoms and preferably a methylene group or an ethylene group.

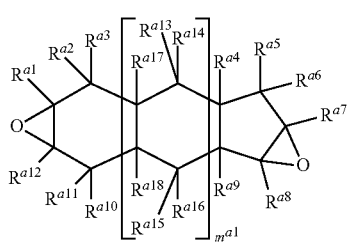

(a1-2)

In the formula (a1-2), $R^{a1}$ to $R^{a18}$ are a group selected from the group consisting of a hydrogen atom, a halogen atom and an organic group. $R^{a2}$ and $R^{a10}$ may be bonded to each other. $R^{a13}$ and $R^{a16}$ may be bonded to each other to form a ring.

$m^{a1}$ is 0 or 1.

The alicyclic epoxy compound represented by the above formula (a1-2) is preferably a compound represented by the following formula (a1-2-1), which corresponds to a compound of the above formula (a1-2) in which $m^{a1}$ is 0.

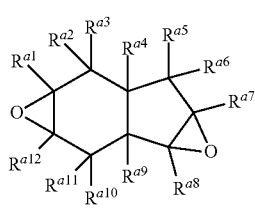

(a1-2-1)

In the formula (a1-2-1), $R^{c1}$ to $R^{c12}$ are a group selected from the group consisting of a hydrogen atom, a halogen atom and an organic group. $R^{a2}$ and $R^{a10}$ may be bonded to each other to form a ring.

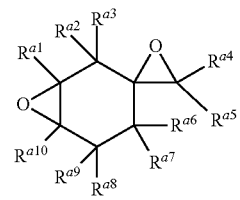

(a1-3)

In the formula (a1-3), $R^{a1}$ to $R^{a10}$ are a group selected from the group consisting of a hydrogen atom, a halogen atom and an organic group. $R^{a2}$ to $R^{a8}$ may be bonded to each other.

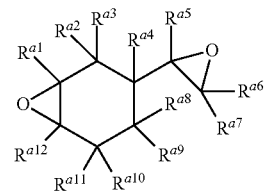

(a1-4)

In the formula (a1-4), $R^{a1}$ to $R^{a12}$ are a group selected from the group consisting of a hydrogen atom, a halogen atom and an organic group. $R^{a2}$ and $R^{a10}$ may be bonded to each other.

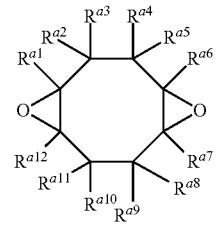

(a1-5)

In the formula (a1-5), $R^{a1}$ to $R^{a12}$ are a group selected from the group consisting of a hydrogen atom, a halogen atom and an organic group.

In the formulae (a1-1) to (a1-5), when $R^{a1}$ to $R^{a18}$ are an organic group, the organic group is not particularly limited as long as the object of the present invention is not inhibited, and the organic group may be a hydrocarbon group, or a group including a carbon atom and a halogen atom, or a group including a halogen atom and a heteroatom such as a an oxygen atom, a sulfur atom, a nitrogen atom or a silicon atom, together with a carbon atom and a hydrogen atom. Examples of the halogen atom include a chlorine atom, a bromine atom, an iodine atom and a fluorine atom, and the like.

The organic group is preferably a hydrocarbon group, a group including a carbon atom, a hydrogen atom and an oxygen atom, a halogenated hydrocarbon group, a group including a carbon atom, an oxygen atom and a halogen atom, and a group including a carbon atom, a hydrogen atom, an oxygen atom and a halogen atom. When the organic group is a hydrocarbon group, the hydrocarbon group may be an aromatic hydrocarbon group, or an aliphatic hydrocarbon group, or a group including an aromatic skeleton and an aliphatic skeleton. The number of carbon atoms of the organic group is preferably 1 or more and 20 or less, more preferably 1 or more and 10 or less, and particularly preferably 1 or more and 5 or less.

Specific examples of the hydrocarbon group include chain alkyl groups such as a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, an n-octyl group, a 2-ethylhexyl group, an n-nonyl group, an n-decyl group, an n-undecyl group, an n-tridecyl group, an n-tetradecyl group, an n-pentadecyl group, an n-hexadecyl group, an n-heptadecyl group, an n-octadecyl group, an n-nonadecyl group and an n-icosyl group; chain alkenyl groups such as a vinyl group, a 1-propenyl group, a 2-n-propenyl group (an allyl group), a 1-n-butenyl group, a 2-n-butenyl group and a 3-n-butenyl group; cycloalkyl groups such as a cyclopropyl group, a cyclobutyl group, a cyclopentyl group, a cyclohexyl group and a cycloheptyl group; aryl groups such as a phenyl group, an o-tolyl group, an m-tolyl group, a p-tolyl group, an α-naphthyl group, a β-naphthyl group, a biphenyl-4-yl group, a biphenyl-3-yl group, a biphenyl-2-yl group, an anthryl group and a phenanthryl group; and aralkyl groups such as a benzyl group, a phenethyl group, an α-naphthylmethyl group, a β-naphthylmethyl group, an α-naphthylethyl group and a β-naphthylethyl group.

Specific examples of the halogenated hydrocarbon group are halogenated chain alkyl groups such as a chloromethyl group, a dichloromethyl group, a trichloromethyl group, a bromomethyl group, a dibromomethyl group, a tribromomethyl group, a fluoromethyl group, a difluoromethyl group, a trifluoromethyl group, a 2,2,2-trifluoroethyl group, a pentafluoroethyl group, a heptafluoropropyl group, a perfluorobutyl group and a perfluoropentyl group, a perfluorohexyl group, a perfluoroheptyl group, a perfluorooctyl group, a perfluorononyl group and a perfluorodecyl group; halogenated cycloalkyl groups such as a 2-chlorocyclohexyl group, a 3-chlorocyclohexyl group, a 4-chlorocyclohexyl group, a 2,4-dichlorocyclohexyl group, a 2-bromocyclohexyl group, a 3-bromocyclohexyl group and a 4-bromocyclohexyl group; halogenated aryl groups such as a 2-chlorophenyl group, a 3-chlorophenyl group, a 4-chlorophenyl group, a 2,3-dichlorophenyl group, a 2,4-dichlorophenyl group, a 2,5-dichlorophenyl group, a 2,6-dichlorophenyl group, a 3,4-dichlorophenyl group, a 3,5-dichlorophenyl group, a 2-bromophenyl group, a 3-bromophenyl group, a 4-bromophenyl group, a 2-fluorophenyl group, a 3-fluorophenyl group and a 4-fluorophenyl group; and halogenated aralkyl groups such as a 2-chlorophenylmethyl group, a 3-chlorophenylmethyl group, a 4-chlorophenylmethyl group, a 2-bromophenylmethyl group, a 3-bromophenylmethyl group, a 4-bromophenylmethyl group, a 2-fluorophenylmethyl group, a 3-fluorophenylmethyl group and a 4-fluorophenylmethyl group.

Specific examples of the group including a carbon atom, a hydrogen atom and an oxygen atom are hydroxy chain alkyl groups such as a hydroxymethyl group, a 2-hydroxyethyl group, a 3-hydroxy-n-propyl group and a 4-hydroxy-n-butyl group; hydroxycycloalkyl groups such as a 2-hydroxycyclohexyl group, a 3-hydroxycyclohexyl group and a 4-hydroxycyclohexyl group; hydroxyaryl groups such as a 2-hydroxyphenyl group, a 3-hydroxyphenyl group, a 4-hydroxyphenyl group, a 2,3-dihydroxyphenyl group, a 2,4-dihydroxyphenyl group, a 2,5-dihydroxyphenyl group, a 2,6-dihydroxyphenyl group, a 3,4-dihydroxyphenyl group and a 3,5-dihydroxyphenyl group; hydroxyaralkyl groups such as a 2-hydroxyphenylmethyl group, a 3-hydroxyphenylmethyl group and a 4-hydroxyphenylmethyl group; chain alkoxy groups such as a methoxy group, an ethoxy group, an n-propoxy group, an isopropoxy group, an n-butyloxy group, an isobutyloxy group, a sec-butyloxy group, a tert-butyloxy group, an n-pentyloxy group, an n-hexyloxy group, an n-heptyloxy group, an n-octyloxy group, a 2-ethylhexyloxy group, an n-nonyloxy group, an n-decyloxy group, an n-undecyloxy group, an n-tridecyloxy group, an n-tetradecyloxy group, an n-pentadecyloxy group, an n-hexadecyloxy group, an n-heptadecyloxy group, an n-octadecyloxy group, an n-nonadecyloxy group and an n-icosyloxy group; chain alkenyloxy groups such as a vinyloxy group, a 1-propenyloxy group, a 2-n-propenyloxy group (an allyloxy group), a 1-n-butenyloxy group, a 2-n-butenyloxy group and a 3-n-butenyloxy group; aryloxy groups such as a phenoxy group, an o-tolyloxy group, an m-tolyloxy group, a p-tolyloxy group, an α-naphthyloxy group, a β-naphthyloxy group, a biphenyl-4-yloxy group, a biphenyl-3-yloxy group, a biphenyl-2-yloxy group, an anthryloxy group and a phenanthryloxy group; aralkyloxy groups such as a benzyloxy group, a phenethyloxy group, an α-naphthylmethyloxy group, a β-naphthylmethyloxy group, an α-naphthylethyloxy group and a β-naphthylethyloxy group; alkoxyalkyl groups such as a methoxymethyl group, an ethoxymethyl group, an n-propoxymethyl group, a 2-methoxyethyl group, a 2-ethoxyethyl group, a 2-n-propoxyethyl group, a 3-methoxy-n-propyl group, a 3-ethoxy-n-propyl group, a 3-n-propoxy-n-propyl group, a 4-methoxy-n-butyl group, a 4-ethoxy-n-butyl group and a 4-n-propoxy-n-butyl group; alkoxyalkoxy groups such as a methoxymethoxy group, an ethoxymethoxy group, an n-propoxymethoxy group, a 2-methoxyethoxy group, a 2-ethoxyethoxy group, a 2-n-propoxyethoxy group, a 3-methoxy-n-propoxy group, a 3-ethoxy-n-propoxy group, a 3-n-propoxy-n-propoxy group, a 4-methoxy-n-butyloxy group, a 4-ethoxy-n-butyloxy group and a 4-n-propoxy-n-butyloxy group; alkoxyaryl groups such as a 2-methoxyphenyl group, a 3-methoxyphenyl group and a 4-methoxyphenyl group; alkoxyaryloxy groups such as a 2-methoxyphenoxy group, a 3-methoxyphenoxy group and a 4-methoxyphenoxy group; aliphatic acyl groups such as a formyl group, an acetyl group, a propionyl group, a butanoyl group, a pentanoyl group, a hexanoyl group, a heptanoyl group, an octanoyl group, a nonanoyl group and a decanoyl group; aromatic acyl groups such as a benzoyl group, an α-naphthoyl group and a β-naphthoyl group; chain alkyloxycarbonyl groups such as a methoxycarbonyl group, an ethoxycarbonyl group, an n-propoxycarbonyl group, an n-butyloxycarbonyl group, an n-pentyloxycarbonyl group, an n-hexyloxycarbonyl group, an n-heptyloxycarbonyl group, an n-octyloxycarbonyl group, an n-nonyloxycarbonyl group and an n-decyloxycarbonyl group; aryloxycarbonyl groups such as a phenoxycarbonyl group, an α-naphthoxycarbonyl group and a β-naphthoxycarbonyl group; aliphatic acyloxy groups such as a formyloxy group, an acetyloxy group, a propionyloxy group, a butanoyloxy group, a pentanoyloxy group, a hexanoyloxy group, a heptanoyloxy group, an octanoyloxy group, a nonanoyloxy group and a decanoyloxy group; and aromatic acyloxy groups such as a benzoyloxy group, an α-naphthoyloxy group and a β-naphthoyloxy group.

It is preferred that $R^{a1}$ to $R^{a18}$ be each independently a group selected from the group consisting of a hydrogen atom, a halogen atom, an alkyl group having 1 or more and 5 or less carbon atoms and an alkoxy group having 1 or more and 5 or less carbon atoms, and it is more preferred that all $R^{a1}$ to $R^{a18}$ be hydrogen atoms particularly because a cured film with good mechanical characteristics is easily formed.

In the formulae (a1-2) to (a1-5), $R^{a1}$ to $R^{a18}$ are the same as $R^{a1}$ to $R^{a18}$ in the formula (a1-1). Examples of the divalent group formed when $R^{a2}$ and $R^{a10}$ are bonded to each other in the formula (a1-2) and the formula (a1-4), when $R^{a13}$ and $R^{a16}$ are bonded to each other in the formula (a1-2), and when $R^{a2}$ and $R^{a8}$ are bonded to each other in the formula (a1-3) include —CH$_2$— and —C(CH$_3$)$_2$—.

Specific examples of suitable compounds of the alicyclic epoxy compound represented by the formula (a1-1) can include alicyclic epoxy compounds represented by the following formulae (a1-1a), (a1-1b) and (a1-1c), 2,2-bis(3,4-epoxycyclohexan-1-yl)propane [=2,2-bis(3,4-epoxycyclohexyl)propane], and the like.

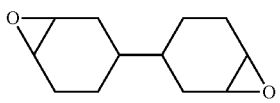
(a1-1a)

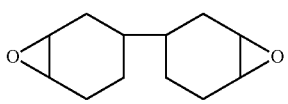
(a1-1b)

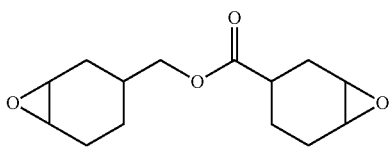
(a1-1c)

Specific examples of suitable compounds of the alicyclic epoxy compound represented by the formula (a1-2) include alicyclic epoxy compounds represented by the following formula (a1-2a) and the following formula (a1-2b).

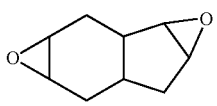
(a1-2a)

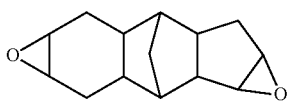
(a1-2b)

Specific examples of suitable compounds of the alicyclic epoxy compound represented by the formula (a1-3) include Sspiro[3-oxatricyclo[3.2.1.0$^{2,4}$]octane-6,2'-oxirane], and the like.

Specific examples of suitable compounds of the alicyclic epoxy compound represented by the formula (a1-4) include 4-vinylcyclohexene dioxide, dipentene dioxide, limonene dioxide, 1-methyl-4-(3-methyloxiran-2-yl)-7-oxabicyclo[4.1.0]heptane, and the like.

Specific examples of suitable compounds of the alicyclic epoxy compound represented by the formula (a1-5) include 1,2,5,6-diepoxycyclooctane, and the like.

Furthermore, a compound represented by the following formula (a1) can be suitably used as the epoxy compound (A).

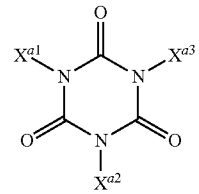
(a1)

In the formula (a1), $X^{a1}$, $X^{a2}$ and $X^{a3}$ are each independently a hydrogen atom or an organic group which may include an epoxy group, and the total number of epoxy groups of $X^{a1}$, $X^{a2}$ and $X^{a3}$ is 2 or more.

The compound represented by the above formula (a1) is preferably a compound represented by the following formula (a1-6).

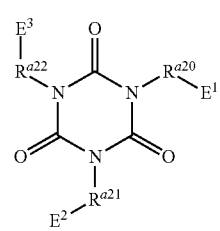
(a1-6)

In the formula (a1-6), $R^{a20}$ to $R^{a22}$ are a linear, branched or cyclic alkylene group, an arylene group, —O—, —C(=O)—, —NH— and a combination thereof, and may be the same or different. $E^1$ to $E^3$ are at least one substituent selected from the group consisting of an epoxy group, an oxetanyl group, an ethylenically unsaturated group, an alkoxysilyl group, an isocyanate group, a blocked isocyanate group, a thiol group, a carboxy group, a hydroxy group and a succinic acid anhydride group, or a hydrogen atom. However, at least two of $E^1$ to $E^3$ are at least one selected from the group consisting of an epoxy group and an oxetanyl group.

In the formula (a1-6), each of at least two of a group represented by $R^{a20}$ and $E^1$, a group represented by $R^{a21}$ and $E^2$, and a group represented by $R^{a22}$ and $E^3$ is preferably a group represented by the following formula (a1-6a). It is more preferred that all of these groups are groups represented by the following formula (a1-6a). A plurality of groups represented by the formula (a1-6a) bonded to one compound are preferably the same.

-L-C$^a$ (a1-6a)

In the formula (a1-6a), L is a linear, branched or cyclic alkylene group, an arylene group, —O—, —C(=O)—, —NH— and a combination thereof, and C$^a$ is an epoxy group. In the formula (a1-6a), L and C$^a$ may be bonded to each other to form a cyclic structure.

In the formula (a1-6a), the linear, branched or cyclic alkylene group as L is preferably an alkylene group having 1 or more and 10 or less carbon atoms, and also the arylene group as L is preferably an arylene group having 5 or more and 10 or less carbon atoms. In the formula (a1-6a), L is preferably a linear alkylene group having 1 or more and 3 or less carbon atoms, a phenylene group, —O—, —C(=O)—, —NH— and a combination thereof, and is preferably a combination of at least one of a linear alkylene group having 1 or more and 3 or less carbon atoms such as a methylene group and a phenylene group or these groups and at least one of —O—, —C(=O)— and —NH—.

As a case where L and $C^a$ are bonded to each other to form a cyclic structure in the formula (a1-6a), for example when a branched alkylene group and an epoxy group are bonded to each other to form a cyclic structure (a structure having an epoxy group of an alicyclic structure), examples thereof include an organic group represented by the following formula (a1-6b) or (a1-6c)

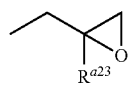

(a1-6b)

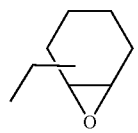

(a1-6c)

In the formula (a1-6b), $R^{a23}$ is a hydrogen atom or a methyl group.

As examples of the compound represented by the formula (a1-6), epoxy compounds having an oxiranyl group or an alicyclic epoxy group will be exemplified. It should be noted, however, that the compound represented by the formula (a1-6) is not limited thereto.

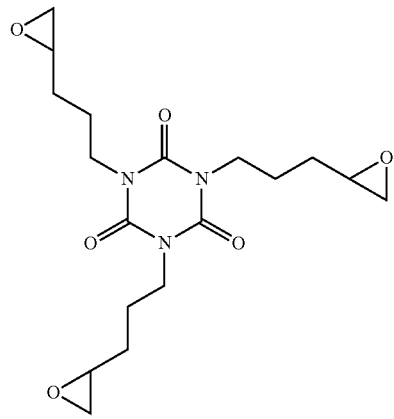

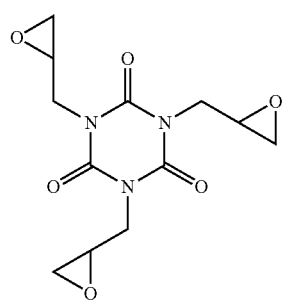

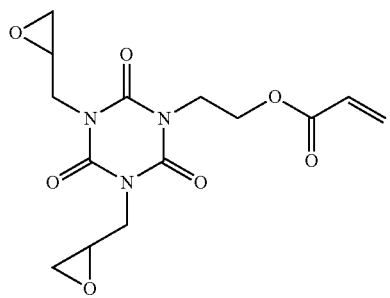

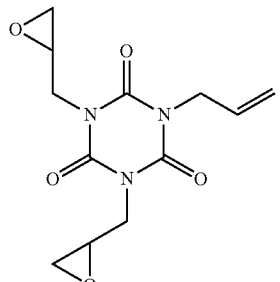 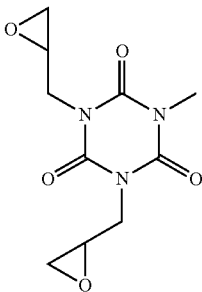

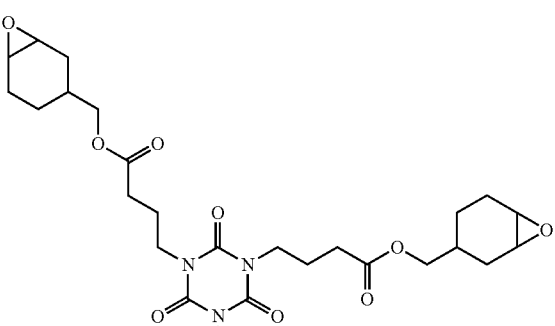

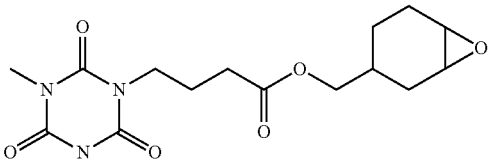

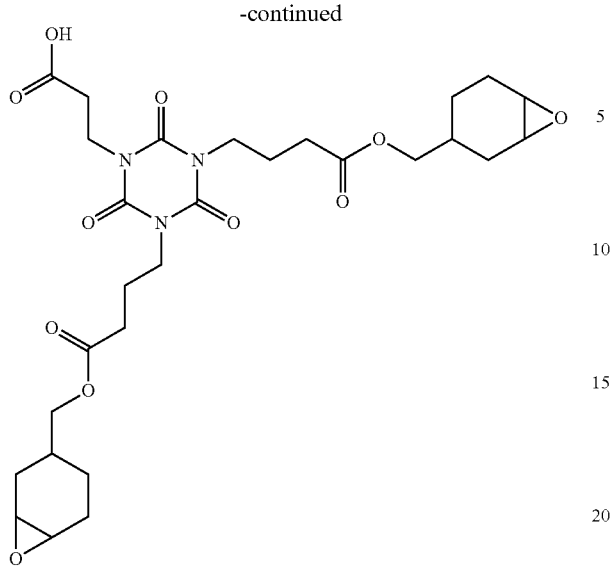

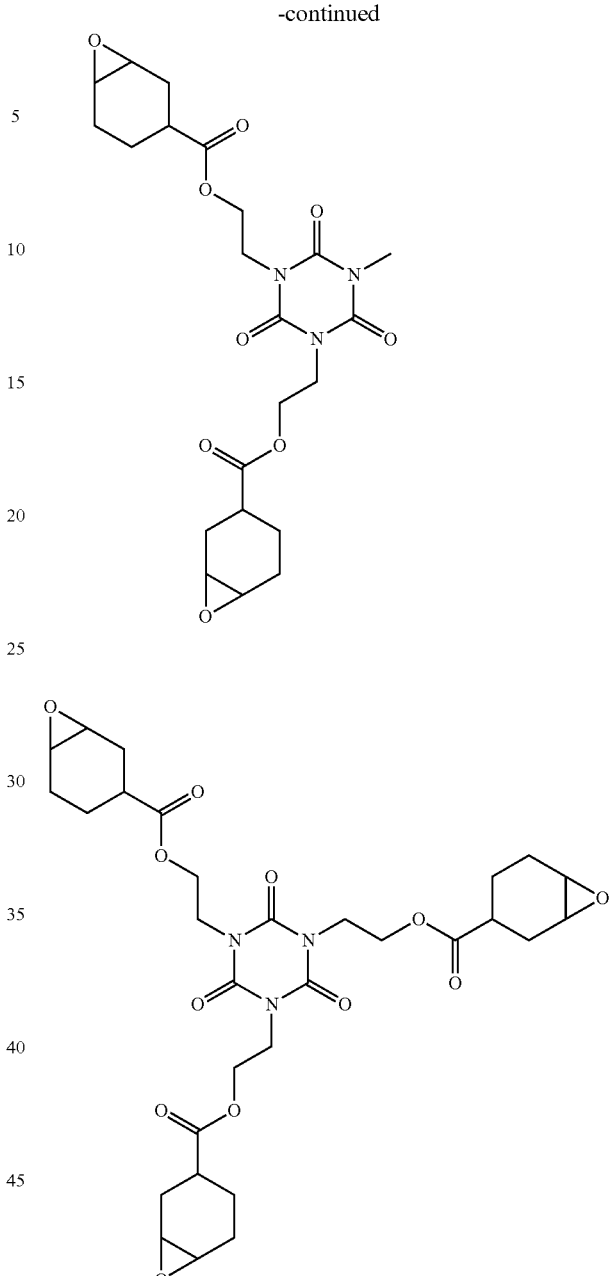

Furthermore, as a compound which can preferably be used as the epoxy compound (A), a siloxane compound having two or epoxy groups in a molecule (hereinafter also referred to as "siloxane compound") is exemplified.

The siloxane compound is a compound having a siloxane skeleton constituted with siloxane bonds (Si—O—Si) and two or more epoxy groups in a molecule. Examples of the siloxane skeleton in the siloxane compound can include a cyclic siloxane skeleton, a polysiloxane skeleton and a basket or ladder type polysilsesquioxane skeleton.

As the siloxane compound, a compound having a cyclic siloxane skeleton represented by the following formula (a1-7) (hereinafter, referred to as "cyclic siloxane") is preferred.

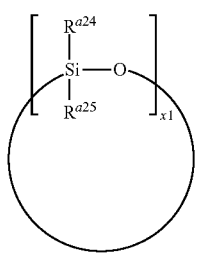

(a1-7)

In the formula (a1-7), $R^{a24}$ and $R^{a25}$ represent a monovalent group including an epoxy group, or an alkyl group. However, at least two of the x1 number of $R^{a24}$ and the x1 number of $R^{a25}$ in the compound represented by the formula (a1-7) are a monovalent group including an epoxy group. Furthermore, x1 in the formula (a1-7) represents an integer of 3 or more. It should be noted that $R^{a24}$ and $R^{a25}$ in the compound represented by the formula (a1-7) may be the same or different. In addition, a plurality of $R^{a24}$ may be the same or different. A plurality of $R^{a25}$ may also be the same or different.

The above monovalent group including an epoxy group is preferably a glycidyl ether group represented by -D-O—$R^{a26}$[where D represents an alkylene group, and $R^{a26}$ represents a glycidyl group.]. Examples of the above D (alkylene group) can include linear or branched alkylene groups having 1 or more and 18 or less carbon atoms such as a methylene group, a methylmethylene group, a dimethylmethylene group, a dimethylene group and a trimethylene group, and the like. In addition, an alicyclic epoxy group-containing group represented by -D-$R^{a27}$ is also preferred. $R^{a27}$ is an epoxycycloalkyl group. D is an alkylene group as described above. Preferred examples of the alkylene group as D are also as described above. The epoxycycloalkyl group as $R^{a27}$ is preferably a 2,3-epoxycyclopentyl group, a 3,4-epoxycyclohexyl group and a 2,3-epoxycyclohexyl group. The group represented by -D-$R^{a27}$ is preferably a 2-(3,4-epoxycyclohexyl)ethyl group.

Preferred examples of the alkyl group as $R^{a24}$ and $R^{a25}$ can include linear or branched alkyl groups having 1 or more and 18 or less carbon atoms (preferably 1 or more and 6 or less carbon atoms, and particularly preferably 1 or more and 3 or less carbon atoms) such as a methyl group, an ethyl group, a propyl group and an isopropyl group.

In the (a1-7), x1 represents an integer of 3 or more, and particularly preferably an integer of 3 or more and 6 or less from the viewpoint of good crosslinking reactivity when a cured film is formed.

The number of epoxy groups in the molecule of the siloxane compound is 2 or more, and preferably 2 or more and 6 or less, and particularly preferably 2 or more and 4 or less from the viewpoint of good crosslinking reactivity when a cured film is formed.

The curable composition may include, in addition to the siloxane compound represented by the formula (a1-7), compounds having a siloxane skeleton such as alicyclic epoxy group-containing cyclic siloxane, an alicyclic epoxy group-containing silicone resin described in Japanese Unexamined Patent Application Publication No. 2008-248169, and an organopolysilsesquioxane resin having at least two epoxy functional groups in one molecule described in Japanese Unexamined Patent Application Publication No. 2008-19422.

More specific examples of the siloxane compound can include cyclic siloxane having two or more epoxy groups in a molecule represented by the following formulae, and the like. In addition, commercial products such as trade name "X-40-2670," "X-40-2701," "X-40-2728," "X-40-2738" and "X-40-2740" (all manufactured by Shinetsu Chemical Co., Ltd.), for example, can be used as the siloxane compound.

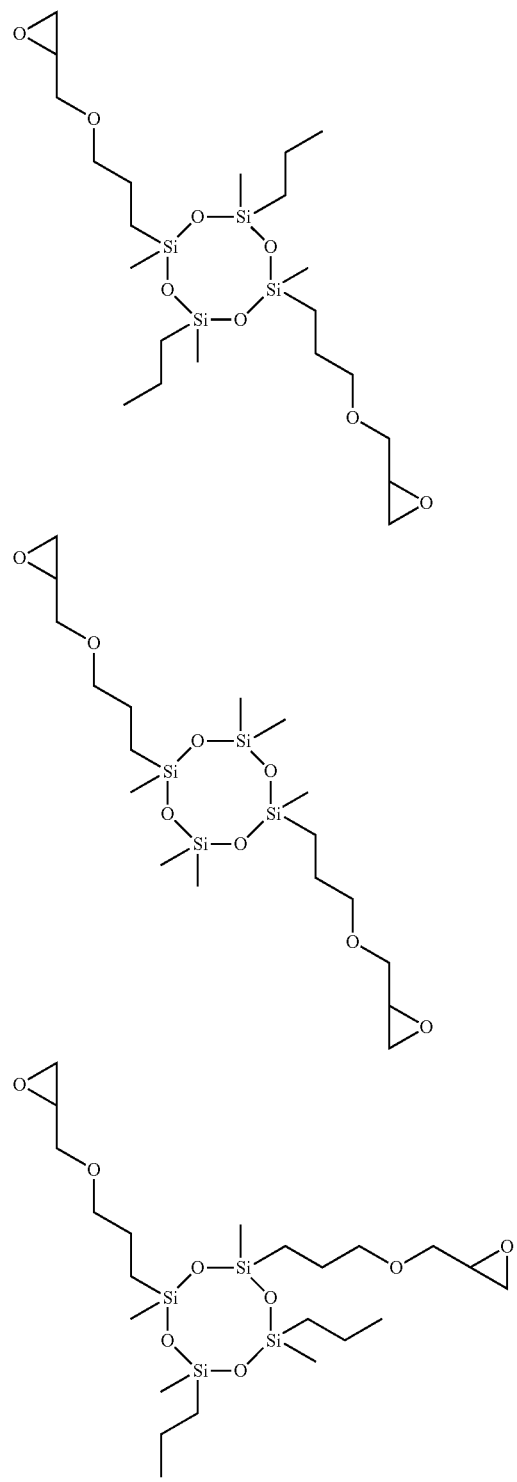

21
-continued
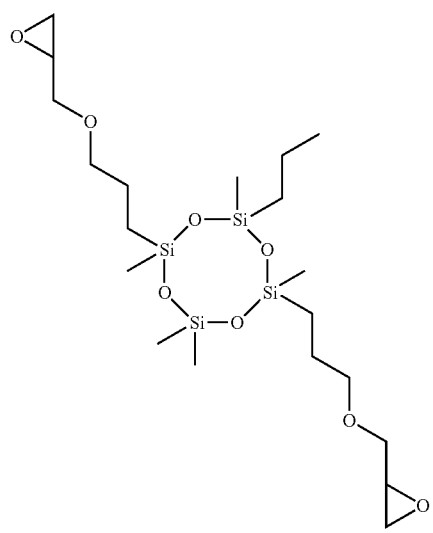
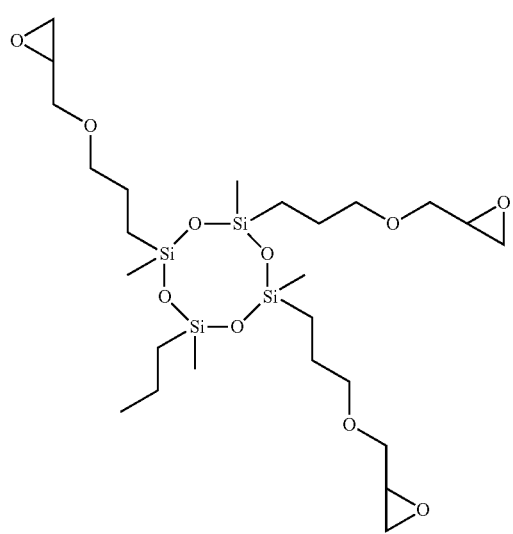
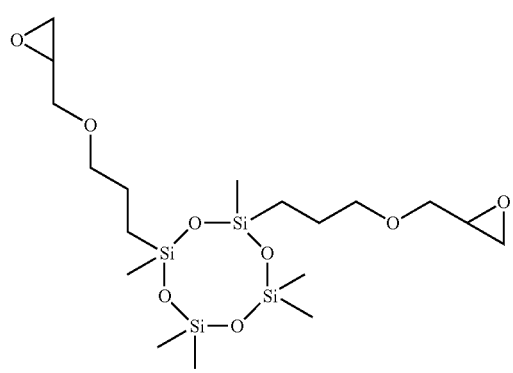
22
-continued
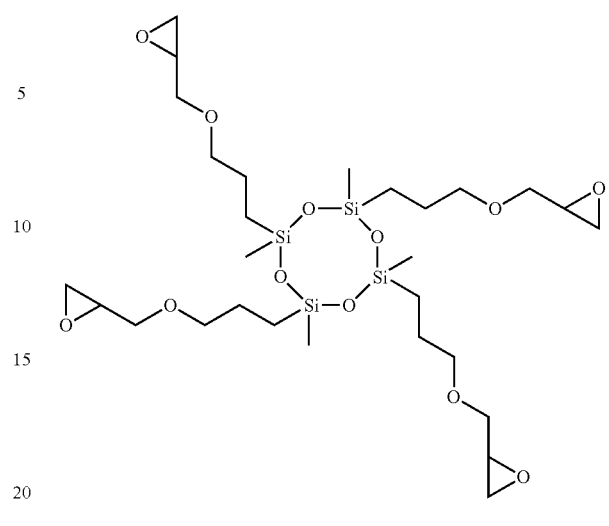
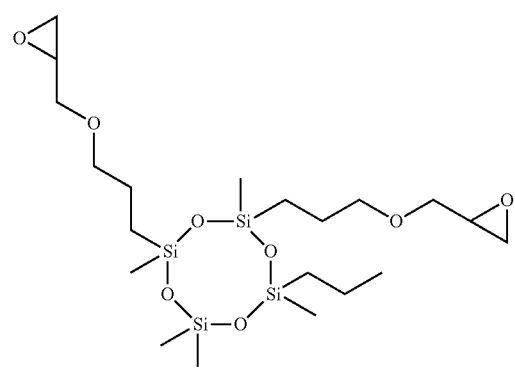
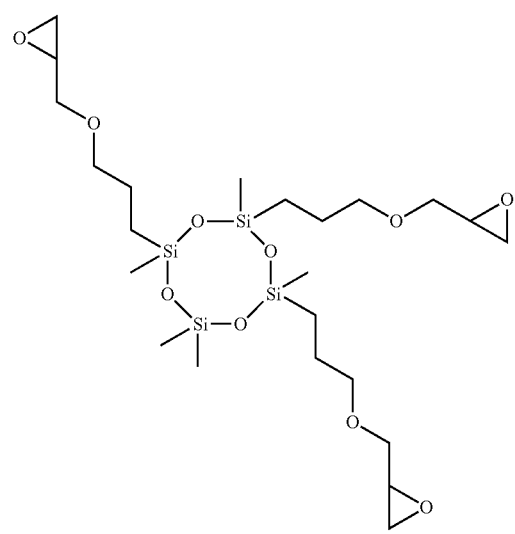

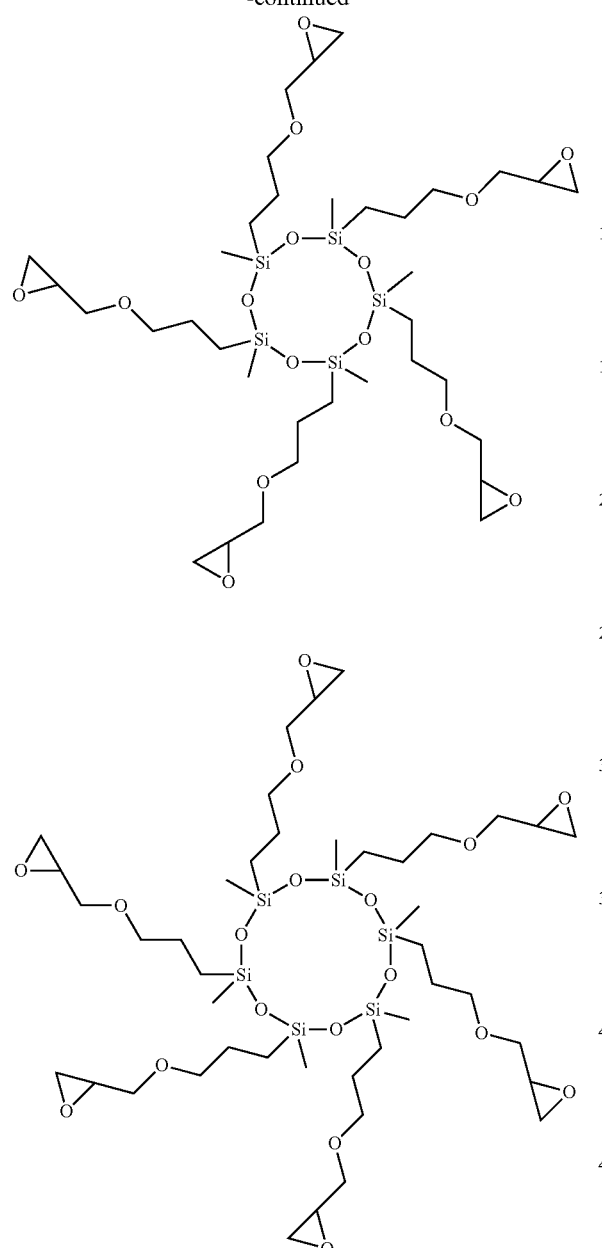
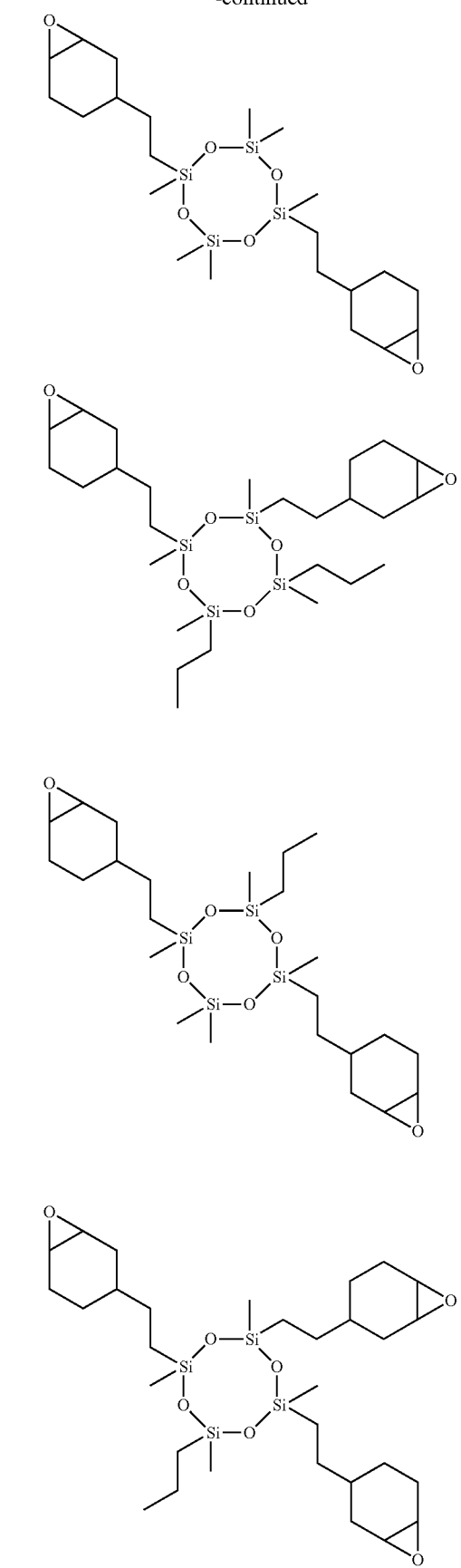

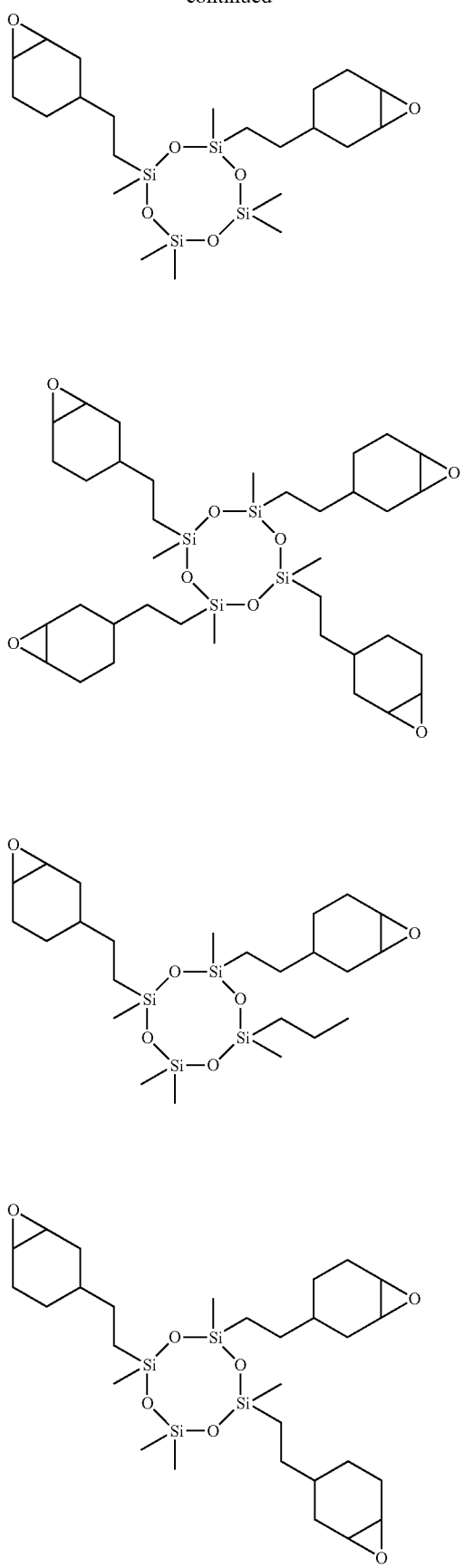
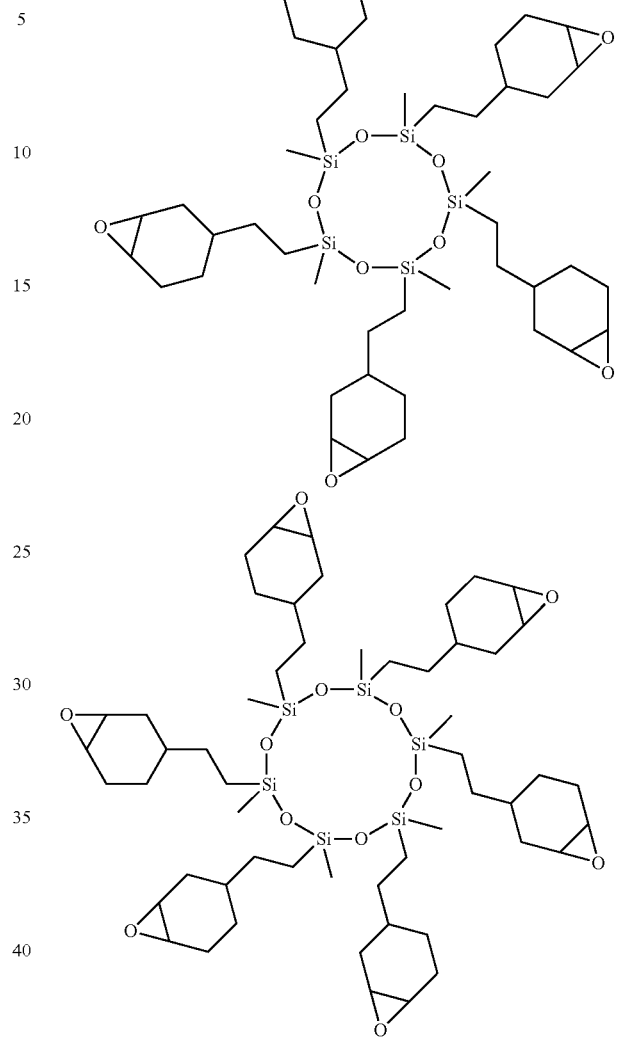

The content of the epoxy compound (A) in the curable composition is for example 30% by mass or more and 98% by mass or less, preferably 40% by mass or more and 94% by mass or less, and more preferably 45% by mass or more and 92% by mass or less with respect to the total mass of curable composition components other than a solvent (S) described below. In addition, the content is preferably 7% by mass or more and 65% by mass or less, more preferably 13% by mass or more and 60% by mass or less, and particularly preferably 17% by mass or more and 55% by mass or less depending on the uses of the curable composition. A cured film with good fluorescence efficiency is easily formed by using an epoxy compound (A) in such amount range.

<Quantum Dot (B)>

The curable composition includes quantum dots (B). As long as the quantum dots (B) are fine particles showing a function as quantum dots, the structure and constituents thereof are not particularly limited. The quantum dots (B) are a nanoscale material having particular optical characteristics depending on quantum mechanics (quantum-confined effect described below), and commonly mean semiconductor nanoparticles. In the description, the quantum dots (B)

also include quantum dots in which the surface of semiconductor nanoparticles is further covered to improve a luminescent quantum yield (quantum dots having a shell structure described below) and quantum dots which are surface-modified for stabilization.

The quantum dots (B) are considered as semiconductor nanoparticles which absorb photons having energy larger than a band gap (a difference in energy between a valence band and a conduction band) and emits light with a wavelength depending on a particle diameter thereof, and examples of elements included in materials for the quantum dots (B) include one or more selected from the group consisting of group II elements (group 2A, group 2B), group III elements (particularly group 3A), group IV elements (particularly group 4A), group V elements (particularly group 5A), and group VI elements (particularly group 6A). Examples of preferred compounds or elements as materials for the quantum dots (B) include group II-VI compounds, group III-V compounds, group IV-VI compounds, group IV elements, group IV compounds and combinations thereof.

Examples of group II-VI compounds include at least one compound selected from the group consisting of CdSe, CdTe, ZnS, ZnSe, ZnTe, ZnO, HgS, HgSe, HgTe, MgSe, MgS and mixtures thereof; at least one compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof; and at least one compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

Examples of group III-V compounds include at least one compound selected from GaN, GaP, GaAs, GaSb, AlN, AlP, AlAs, AlSb, InN, InP, InAs, InSb and mixtures thereof; at least one compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP and mixtures thereof; and at least one compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

Examples of group IV-VI compounds include at least one compound selected from SnS, SnSe, SnTe, PbS, PbSe, PbTe and mixtures thereof; at least one compound selected from SnSeS, SnSeTe, SnSTe, PbSeS, PbSeTe, PbSTe, SnPbS, SnPbSe, SnPbTe and mixtures thereof; and at least one compound selected from SnPbSSe, SnPbSeTe, SnPbSTe and mixtures thereof.

Examples of group IV elements include at least one compound selected from Si, Ge and mixtures thereof. Examples of group IV compounds include at least one compound selected from SiC, SiGe and mixtures thereof.

The structure of quantum dots (B) can be a homogeneous structure made of one compound, or a composite structure made of two or more compounds; however, in order to improve luminescent quantum yields of the above compounds, the structure of quantum dots (B) is preferably a core-shell structure in which the core is covered with one or more shell layers, and more preferably a structure in which the particle surface of a compound, a core material, is epitaxially covered with a semiconductor material. When group II-VI CdSe, for example, is used as a core material, ZnS, ZnSSe and the like are used as its covering layer (shell). The shell preferably has the same lattice constant as a core material has, and a material combination in which the difference in the lattice constant between the core and shell is small is properly selected.

The quantum dots (B) preferably include a compound including Cd or In as a constituent from the viewpoint of fluorescence efficiency, and more preferably include a compound including In as a constituent when taking into account safety.

Specific suitable examples of quantum dots (B) of the homogeneous structure type not having a shell layer include $AgInS_2$ and Zn-doped $AgInS_2$. Examples of quantum dots (B) of the core-shell type include InP/ZnS, InP/ZnSSe, $CuInS_2$/ZnS, and (ZnS/$AgInS_2$) solid solution/ZnS. It should be noted that materials for quantum dots (B) of the core-shell type are described as (core material)/(shell layer material) in the above description.

In addition, a shell of the core-shell structure has preferably a multi-layer structure from the viewpoint of improvement of safety and a luminescent quantum yield and more preferably two layers. In a core-multilayer shell structure, the material of core is preferably at least one compound selected from the group consisting of InP, ZnS and ZnSe, and more preferably includes InP. The proportion of InP included is 50% by mass or more and 100% by mass or less of the total mass of core, preferably 60% by mass or more and 99% by mass or less, and more preferably 82% by mass or more and 95% by mass or less. In addition, the proportion of ZnS and/or ZnSe included is 0% by mass or more and 50% by mass or less of the total mass of core, preferably 1% by mass or more and 40% by mass or less, and more preferably 5% by mass or more and 18% by mass or less.

In a multilayer shell structure, a material for the first shell is preferably one or more selected from ZnS, ZnSe and ZnSSe. The proportion of one or more selected from ZnS, ZnSe and ZnSSe included is for example 50% by mass or more and 100% by mass or less, preferably 75% by mass or more and 98% by mass or less, and more preferably 80% by mass or more and 97% by mass or less based on the total mass of the first shell. When a material for the first shell is a mixture of ZnS and ZnSe, the mixing ratio (mass ratio) is not particularly limited, and is 1/99 or more and 99/1 or less, and preferably 10/90 or more and 90/10 or less.

In a multilayer shell structure, the second shell is grown on the surface of the first shell. A material for the second shell is preferably equivalent to the material for the first shell (however, differences in the lattice constant with respect to the core differ from each material. That is, a case where 99% or more in the materials have the same quality is excluded). The proportion of one or more selected from ZnS, ZnSe and ZnSSe included is for example 50% by mass or more and 100% by mass or less, preferably 75% by mass or more and 98% by mass or less and more preferably 80% by mass or more and 97% by mass or less based on the total mass of the second shell. When a material for the second shell is a mixture of two selected from ZnS, ZnSe and ZnSSe, the mixing ratio (mass ratio) is not particularly limited, and is 1/99 or more and 99/1 or less, and 10/90 or more and 90/10 or less.

The first shell and the second shell in a multilayer shell structure have difference lattice constants. A difference in the lattice constant between the core and the first shell for example is 2% or more and 8% or less, preferably 2% or more and 6% or less, and more preferably 3% or more and 5% or less. In addition, a difference in the lattice constant between the core and the second shell is 5% or more and 13% or less, preferably 5% or more and 12% or less, more preferably 7% or more and 10% or less, and further preferably 8% or more and 10% or less.

In addition, a difference in the lattice constant between the first shell and the second shell is for example 3% or more and 9% or less, preferably 3% or more and 7% or less, and more preferably 4% or more and 6% or less.

The quantum dots (B) by these core-multilayer shell structures can have an emission wavelength in a range of 400 nm or higher 800 nm or lower (furthermore a range of 470 or higher 650 nm or lower, particularly a range of 540 nm or higher 580 nm or lower).

Examples of the quantum dots (B) by these core-multilayer shell structures include InP/ZnS/ZnSe and InP/ZnSe/ZnS.

In addition, the quantum dots (B) may be surface-modified. Examples thereof include phosphorus compounds such as phosphine, phosphine oxide and trialkyl phosphines; organic nitrogen compounds such as pyridine, aminoalkanes and tertiary amines; organic sulfur compounds such as mercaptoalcohol, thiol, dialkyl sulfides and dialkyl sulfoxides; and surface modifying agents (organic ligands) such as higher fatty acids and alcohols.

Two or more of the above quantum dots (B) may be used in combination, and quantum dots (B) of the core-(multilayer) shell type and quantum dots (B) of the homogeneous structure type may be used in combination.

The average particle diameter of quantum dots (B) is not particularly limited as long as the particles can function as quantum dots, and the diameter is preferably 0.5 nm or more and 20 nm or less, more preferably 1.0 nm or more and 15 nm or less, and further preferably 2 nm or more and 7 nm or less. In quantum dots (B) of the core-(multilayer) shell type, the size of core is for example 0.5 nm or more and 10 nm or less, and preferably 2 nm or more and 5 nm or less. The average thickness of the shell is preferably 0.4 nm or more and 2 nm or less, and more preferably 0.4 nm or more and 1.4 nm or less. When the shell includes the first shell and the second shell, the average thickness of the first shell is for example 0.2 nm or more and 1 nm or less, and preferably 0.2 nm or more and 0.7 nm or less. The average thickness of the second shell does not depend on the average thickness of the first shell, and is for example 0.2 nm or more and 1 nm or less, and preferably 0.2 nm or more and 0.7 nm or less.

The quantum dots (B) having an average particle diameter within such range show a quantum-confined effect and function well as quantum dots, and moreover are easily prepared and have stable fluorescence characteristics. It should be noted that the average particle diameter of quantum dots (B) can be defined by, for example, applying a dispersion liquid of quantum dots (B) onto a substrate and drying the liquid, removing a volatile component and then observing the surface by transmission electron microscope (TEM). Typically, this average particle diameter can be defined as the number average diameter of circle equivalent diameters of particles obtained by image analysis of the TEM image.

The shape of quantum dots (B) is not particularly limited. Examples of the shape of quantum dots (B) include spherical shape, spheroid shape, cylindrical shape, polygonal shape, disk shape and polyhedral shape and the like. Among these, a spherical shape is preferred from the viewpoint of handleability and accessibility.

Because characteristics as an optical film and wavelength conversion characteristics are good, the quantum dots (B) preferably include one or more selected from the group consisting of a compound (B1) having a fluorescence maximum in a wavelength range of 500 nm or higher 600 nm or lower, and a compound (B2) having a fluorescence maximum in a wavelength range of 600 nm or higher 700 nm or lower, and more preferably includes one or more selected from the group consisting of the compound (B1) and compound (B2).

A method for producing quantum dots (B) is not particularly limited. Quantum dots produced by various well-known methods can be used as the quantum dots (B). As the method for producing the quantum dots (B), for example, a method in which an organometal compound is thermally decomposed in a coordinating organic solvent can be used. In addition, the quantum dots (B) of the core-shell structure type can be produced by a method in which homogeneous cores are formed by reaction and then a shell layer precursor is allowed to react in the presence of dispersed cores to form a shell layer. In addition, for example, quantum dots (B) having the above core-multilayer shell structure can be produced by a method described in WO 2013/127662. It should be noted that various commercially available quantum dots (B) can be also used.

The quantum dot (B) content is preferably 1% by mass or more and 50% by mass or less and more preferably 5% by mass or more and 40% by mass or less with respect to the total mass of curable composition components other than a solvent (S) described below. When the quantum dot (B) has a shell layer or is surface-modified, the content is preferably 1% by mass or more and 12% by mass or less and more preferably 3% by mass or more and 10% by mass or less. When the quantum dot (B) has only semiconductor nanoparticles (a case where a shell layer and/or a surface modifying agent is not included), the content is preferably 0.07% by mass or more and 3% by mass or less and more preferably 0.1% by mass or more and 1% by mass or less. When the content of the quantum dot (B) is in the above range, a curable composition which can form a film having good characteristics as an optical film and wavelength conversion characteristics is easily obtained.

<Acid Generator (C)>

The curable composition includes an acid generator (C) as a component to polymerize the epoxy compound (A). As the acid generator (C), acid generators which have been conventionally used to cure an epoxy compound can be used without particular limitation. It is typical that as the acid generator (C), onium salts such as a sulfonium salt and an iodonium salt are preferably used.

The curable composition preferably includes a sulfonium salt represented by the following formula (c1) (hereinafter "sulfonium salt (Q)") as the acid generator (C). The curable composition also preferably includes an onium salt including a gallate anion and/or borate anion. When the curable composition includes a sulfonium salt (Q) as the acid generator (C), the curing of the epoxy compound (A) is easily allowed to proceed.

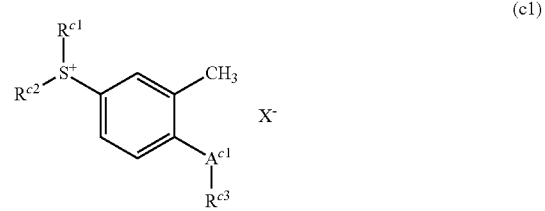

In the formula (c1), $R^{c1}$ and $R^{c2}$ independently represent an alkyl group optionally substituted with a halogen atom or a group represented by the following formula (c2); $R^{c1}$ and $R^{c2}$ may be bonded to each other to form a ring together with the sulfur atom in the formula; $R^{c3}$ represents a group represented by the following formula (c3) or a group represented by the following formula (c4); $A^{c1}$ represents S, O or Se; $X^-$ represents a monovalent anion; with the proviso that $R^{c1}$ and $R^{c2}$ are not simultaneously an alkyl group optionally substituted with a halogen atom.

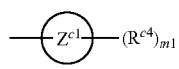
(c2)

In the formula (c2), a ring $Z^{c1}$ represents an aromatic hydrocarbon ring; $R^{c4}$ represents an alkyl group optionally substituted with a halogen atom, a hydroxy group, an alkoxy group, an alkylcarbonyl group, an alkoxycarbonyl group, an acyloxy group, an alkylthio group, a thienyl group, a thienylcarbonyl group, a furanyl group, a furanylcarbonyl group, a selenophenyl group, a selenophenylcarbonyl group, a heterocyclic aliphatic group, an alkylsulfinyl group, an alkylsulfonyl group, a hydroxy(poly)alkyleneoxy group, an optionally substituted amino group, a cyano group, a nitro group or a halogen atom; and m1 represents an integer of 0 or more.

(c3)

In the formula (c3), $R^{c5}$ represents an alkylene group optionally substituted with a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group or a halogen atom, or a group represented by the following formula (c5); $R^{c6}$ represents an alkyl group optionally substituted with a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group or a halogen atom, or a group represented by the following formula (c6); $A^{c2}$ represents a single bond, S, O, a sulfinyl group or a carbonyl group; and n1 represents 0 or 1.

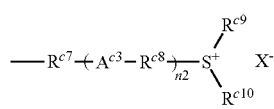
(c4)

In the formula (c4), $R^{c7}$ and $R^{c8}$ independently represent an alkylene group optionally substituted with a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group or a halogen atom, or a group represented by the following formula (c5); $R^{c9}$ and $R^{c10}$ independently represent an alkyl group optionally substituted with a halogen atom or a group represented by the above formula (c2); $R^{c9}$ and $R^{c10}$ may be bonded to each other to form a ring together with the sulfur atom in the formula; $A^{c3}$ represents a single bond, S, O, a sulfinyl group or a carbonyl group; $X^-$ is the same as defined above; n2 represents 0 or 1; with the proviso that $R^{c9}$ and $R^{c10}$ are not simultaneously an alkyl group optionally substituted with a halogen atom.

(c5)

In the formula (c5), a ring $Z^{c2}$ represents an aromatic hydrocarbon ring; $R^{c11}$ represents an alkyl group optionally substituted with a halogen atom, a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group or a halogen atom; and m2 represents an integer of 0 or more.

(c6)

In the formula (c6), a ring $Z^{c3}$ represents an aromatic hydrocarbon ring; $R^{c12}$ represents an alkyl group optionally substituted with a halogen atom, a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, a thienylcarbonyl group, a furanylcarbonyl group, a selenophenylcarbonyl group, an aryl group, a heterocyclic group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group or a halogen atom; and m3 represents an integer of 0 or more.

(Sulfonium Salt (Q))

The sulfonium salt (Q) will now be described. The sulfonium salt (Q) is characterized in that a methyl group is bonded to the carbon atom at the ortho position of the carbon atom to which $A^{c1}$ is bonded in the benzene ring in the above formula (c1). Because of the methyl group at the above position, the sulfonium salt (Q) easily generates a proton and is highly sensitive to active energy rays such as ultraviolet rays compared to conventional sulfonium salts.

In the above formula (c1), both of $R^{c1}$ and $R^{c2}$ are preferably a group represented by the above formula (c2). $R^{a1}$ and $R^{c2}$ may be the same or different. In the formula (c1), when $R^{c1}$ and $R^{c2}$ are bonded to each other to form a ring together with the sulfur atom in the formula, the number of atoms constituting a ring formed is preferably 3 or more and 10 or less including the sulfur atom, and more preferably 5 or more and 7 or less. The ring thus formed may be a polycyclic ring, and is preferably a polycyclic ring obtained by condensation of monocycles in which the number of atoms constituting the rings is 5 or more and 7 or less. In the above formula (c1), both $R^{c1}$ and $R^{c2}$ are preferably a phenyl group. In the above formula (c1), $R^{c3}$ is preferably a group represented by the above formula (c3). In the above formula (c1), $A^{c1}$ is preferably S or O, and more preferably S.

In the above formula (c2), $R^{c4}$ is preferably an alkyl group optionally substituted with a halogen atom, a hydroxy group, an alkylcarbonyl group, a thienylcarbonyl group, a furanylcarbonyl group, a selenophenylcarbonyl group, an optionally substituted amino group or a nitro group, and more preferably an alkyl group optionally substituted with a halogen atom, an alkylcarbonyl group or a thienylcarbonyl group. In the above formula (c2), m1 can be selected depending on the type of the ring $Z^{c1}$, and may be, for example, an integer of 0 or more and 4 or less, preferably an integer of 0 or more and 3 or less, and more preferably an integer of 0 or more and 2 or less.

In the above formula (c3), $R^{c5}$ is preferably an alkylene group; an alkylene group substituted with a hydroxy group, an optionally substituted amino group or a nitro group; or a group represented by the above formula (c5); and more preferably a group represented by the above formula (c5). In the above formula (c3), $R^{c6}$ is preferably an alkyl group; an alkyl group substituted with a hydroxy group, an optionally substituted amino group or a nitro group; or a group represented by the above formula (c6); and more preferably a group represented by the above formula (c6). In the above formula (c3), $A^{c2}$ is preferably S or O, and more preferably S. In the above formula (c3), n1 is preferably 0.

In the above formula (c4), $R^{c7}$ and $R^{c8}$ are independently preferably an alkylene group; an alkylene group substituted with a hydroxy group, an optionally substituted amino group or a nitro group; or a group represented by the above formula (c5); and more preferably a group represented by the above formula (c5). $R^{c7}$ and $R^{c8}$ may be the same or different. In the above formula (c4), both $R^{c9}$ and $R^{c10}$ are preferably a group represented by the above formula (c2). $R^{c9}$ and $R^{c10}$ may be the same or different. In the above formula (c4), when $R^{c9}$ and $R^{c10}$ are bonded to each other to form a ring together with the sulfur atom in the formula, the number of atoms constituting a ring formed is preferably 3 or more and 10 or less including the sulfur atom, and more preferably 5 or more and 7 or less. The ring thus formed may be a polycyclic ring, and is preferably a polycyclic ring obtained by condensation of monocycles in which the number of atoms constituting the rings is 5 or more and 7 or less. In the above formula (c4), $A^{c3}$ is preferably S or O, and more preferably S. In the above formula (c4), n2 is preferably 0.

In the above formula (c5), $R^{c11}$ is preferably an alkyl group optionally substituted with a halogen atom, a hydroxy group, an optionally substituted amino group or a nitro group, and more preferably an alkyl group optionally substituted with a halogen atom. In the above formula (c5), m2 can be selected depending on the type of the ring $Z^{c2}$, and may be, for example, an integer of 0 or more and 4 or less, preferably an integer of 0 or more and 3 or less, and more preferably an integer of 0 or more and 2 or less.

In the above formula (c6), $R^{c12}$ is preferably an alkyl group optionally substituted with a halogen atom, a hydroxy group, an alkylcarbonyl group, a thienylcarbonyl group, a furanylcarbonyl group, a selenophenylcarbonyl group, an optionally substituted amino group or a nitro group, and more preferably an alkyl group optionally substituted with a halogen atom, an alkylcarbonyl group or a thienylcarbonyl group. In the above formula (c6), m3 can be selected depending on the type of the ring $Z^{c3}$ and may be, for example, an integer of 0 or more and 4 or less, preferably an integer of 0 or more and 3 or less, and more preferably an integer of 0 or more and 2 or less.

In the above formula (c1), $X^-$ is a monovalent anion corresponding to an acid (HX) that is generated by irradiating the sulfonium salt (Q) with active energy (such as heat, visible light, ultraviolet rays, an electron beam, and X rays). When the sulfonium salt (Q) is used as an acid generator, suitable examples of $X^-$ include a monovalent polyatomic anion, and $X^-$ is more preferably an anion represented by $MY_a^-$, $(Rf)_b PF_{6-b}^-$, $R^{x1}_c BY_{4-c}^-$, $R^{x1}_c GaY_{4-c}^-$, $R^{x2}SO_3^-$, $(R^{x2}SO_2)_3 C^-$ or $(R^{x2}SO_2)_2 N^-$. In addition, $X^-$ may be a halogen anion and examples thereof include a fluoride ion, a chloride ion, a bromide ion, an iodide ion and the like.

M represents a phosphorus atom, a boron atom or an antimony atom. Y represents a halogen atom (preferably a fluorine atom).

Rf represents an alkyl group in which 80 mol % or higher of hydrogen atoms are substituted with fluorine atoms (an alkyl group having 1 or more and 8 or less carbon atoms is preferred). Examples of the alkyl group which is used as Rf by fluorine substitution include linear alkyl groups (such as methyl, ethyl, propyl, butyl, pentyl and octyl), branched alkyl groups (such as isopropyl, isobutyl, sec-butyl and tert-butyl), and cycloalkyl groups (such as cyclopropyl, cyclobutyl, cyclopentyl and cyclohexyl) and the like. The proportion of hydrogen atoms substituted with fluorine atoms in these alkyl groups in Rf is preferably 80 mol % or higher, further preferably 90% or higher, particularly preferably 100% based on the number of moles of hydrogen atoms included in an original alkyl group. When the proportion of substitution with fluorine atoms is within these preferred ranges, the sulfonium salt (Q) has a further good light sensitivity. Particularly preferred examples of Rf include $CF_3^-$, $CF_3CF_2^-$, $(CF_3)_2 CF^-$, $CF_3 CF_2 CF_2^-$, $CF_3 CF_2 CF_2 CF_2^-$, $(CF_3)_2 CFCF_2^-$, $CF_3 CF_2 (CF_3)CF^-$ and $(CF_3)_3 C^-$. The b number of Rf are independent each other and thus may be the same or different.

P represents a phosphorus atom, and F represents a fluorine atom.

$R^{x1}$ represents a phenyl group in which part of the hydrogen atoms are substituted with at least one element or electron withdrawing group. Examples of the one element include halogen atoms such as a fluorine atom, a chlorine atom and a bromine atom. Examples of the electron withdrawing group include a trifluoromethyl group, a nitro group and a cyano group, and the like. Among these, a phenyl group in which at least one hydrogen atom is substituted with a fluorine atom or a trifluoromethyl group is preferred. The c number of $R^{x1}$ are independent each other and thus may be the same or different.

B represents a boron atom, and Ga represents a gallium atom.

$R^{x2}$ represents an alkyl group having 1 or more and 20 or less carbon atoms, a fluoroalkyl group having 1 or more and 20 or less carbon atoms, or an aryl group having 6 or more and 20 or less carbon atoms, the alkyl group and the fluoroalkyl group may be linear, branched or cyclic, and the alkyl group, fluoroalkyl group or aryl group may be unsubstituted or have a substituent. Examples of the above substituent include a hydroxy group, an optionally substituted amino group (for example, groups exemplified in the description described below regarding the above formulae (c2) to (c6)), and a nitro group, and the like. In addition, the carbon chain of the alkyl group, fluoroalkyl group or aryl group represented by $R^{x2}$ may have a heteroatom such as an oxygen atom, a nitrogen atom or a sulfur atom. In particular, the carbon chain of the alkyl group or fluoroalkyl group represented by $R^{x2}$ may have a divalent functional group (for example, an ether bond, a carbonyl bond, an ester bond, an amino bond, an amide bond, an imide bond, a sulfonyl bond, a sulfonylamide bond, a sulfonylimide bond, a urethane bond, etc.).

When the alkyl group, fluoroalkyl group or aryl group represented by $R^{x2}$ has the above substituent, heteroatom or functional group, the number of the above substituents, heteroatoms or functional groups may be one or two or more.

S represents a sulfur atom, O represents an oxygen atom, C represents a carbon atom, and N represents a nitrogen atom.

a represents an integer of 4 or more and 6 or less.

b is preferably an integer of 1 or more and 5 or less, further preferably an integer of 2 or more and 4 or less, and particularly preferably 2 or 3.

c is preferably an integer of 1 or more and 4 or less, and further preferably 4.

Examples of the anion represented by $MY_a^-$ include an anion represented by $SbF_6^-$, $PF_6^-$ or $BF_4^-$, and the like.

Examples of the anion represented by $(Rf)_bPF_{6-b}^-$ include an anion represented by $(CF_3CF_2)_2PF_4^-$, $(CF_3CF_2)_3PF_3^-$, $((CF_3)_2CF)_2PF_4^-$, $((CF_3)_2CF)_3PF_3^-$, $(CF_3CF_2CF_2)_2PF_4^-$, $(CF_3CF_2CF_2)_3PF_3^-$, $((CF_3)_2CFCF_2)_2PF_4^-$, $((CF_3)_2CFCF_2)_3PF_3^-$, $(CF_3CF_2CF_2CF_2)_2PF_4^-$ or $(CF_3CF_2CF_2CF_2)_3PF_3^-$, and the like. Among these, an anion represented by $(CF_3CF_2)_3PF_3^-$, $(CF_3CF_2CF_2)_3PF_3^-$, $((CF_3)_2CF)_3PF_3^-$, $((CF_3)_2CF)_2PF_4^-$, $((CF_3)_2CFCF_2)_3PF_3^-$ or $((CF_3)_2CFCF_2)_2PF_4^-$ is preferred.

The anion represented by $R^{x1}_cBY_{4-c}^-$ is preferably:

$R^{x1}_cBY_{4-c}^-$, wherein $R^{x1}$ represents a phenyl group in which at least part of hydrogen atoms are substituted with a halogen atom or an electron withdrawing group, Y represents a halogen atom, and c represents an integer of 1 or more and 4 or less, and examples thereof include an anion represented by $(C_6F_5)_4B^-$, $((CF_3)_2C_6H_3)_4B^-$, $(CF_3C_6H_4)_4B^-$, $(C_6F_5)_2BF_2^-$, $C_6F_5BF_3^-$ or $(C_6H_3F_2)_4B^-$, and the like. Among these, an anion represented by $(C_6F_5)_4B^-$ or $((CF_3)_2C_6H_3)_4B^-$ is preferred.

Examples of the anion represented by $R^{x1}_cGaY_{4-c}^-$ include tetrakis(nonafluorobiphenyl-4-yl)gallate anion, tetrakis (heptafluoronaphthalene-1-yl)gallate anion, tetrakis (pentafluorophenyl)gallate anion, tetrakis(3,4,5-trifluorophenyl)gallate anion, tetrakis(nonafluorobiphenyl-2-yl) gallate anion, tetrakis(heptafluoronaphthalene-2-yl)gallate anion, tetrakis(nonafluoroanthracene-7-yl)gallate anion, tetrakis(4'-(methoxy)biphenyl-4-yl)gallate anion, tetrakis(2,4,6-tris(trifluoromethyl)phenyl)gallate anion, tetrakis(3,5-bis (trifluoromethyl)phenyl)gallate anion, tetrakis(2,3-bis (pentafluoroethyl)naphthyl)gallate anion, tetrakis(2-isopropoxy-hexafluoronaphthyl)gallate anion, tetrakis(9,10-bis(heptafluoropropyl)hepthafluoroanthryl)gallate anion, tetrakis(9-nonafluorophenanthryl)gallate anion, tetrakis(4-[tri(isopropyl)silyl]-tetrafluorophenyl)gallate anion, tetrakis (9,10-bis(p-tolyl)-heptafluorophenanthryl)gallate anion, tetrakis(4-[dimethyl(t-butyl)silyl]-tetrafluorophenyl)gallate anion, monophenyltris(pentafluorophenyl)gallate anion, monoperfluorobutyltris(pentafluorophenyl)gallate anio and the like. More preferably, an anion represented by $(C_6F_5)_4Ga^-$, $((CF_3)_2C_6H_3)_4Ga^-$, $(CF_3C_6H_4)_4Ga^-$, $(C_6F_5)_2GaF_2^-$, $C_6F_5GaF_3^-$, $(C_6H_3F_2)_4Ga^-$ or the like is exemplified. Among these, an anion represented by $(C_6F_5)_4Ga^-$ or $((CF_3)_2C_6H_3)_4Ga^-$ is further preferred.

Examples of the anion represented by $R^{x2}SO_3^-$ include trifluoromethanesulfonate anion, pentafluoroethanesulfonate anion, heptafluoropropanesulfonate anion, nonafluorobutanesulfonate anion, pentafluorophenylsulfonate anion, p-toluenesulfonate anion, benzenesulfonate anion, camphor sulfonate anion, methanesulfonate anion, ethanesulfonate anion, propanesulfonate anion and butanesulfonate anion, and the like. Among these, trifluoromethanesulfonate anion, nonafluorobutanesulfonate anion, methanesulfonate anion, butanesulfonate anion, camphor sulfonate anion, benzenesulfonate anion or p-toluenesulfonate anion is further preferred.

Examples of the anion represented by $(R^{x2}SO_2)_3C^-$ include an anion represented by $(CF_3SO_2)_3C^-$, $(C_2F_5SO_2)_3C^-$, $(C_3F_7SO_2)_3C^-$ or $(C_4F_9SO_2)_3C^-$, and the like.

Examples of the anion represented by $(R^{x2}SO_2)_2N^-$ include an anion represented by $(CF_3SO_2)_2N^-$, $(C_2F_5SO_2)_2N^-$, $(C_3F_7SO_2)_2N^-$ or $(C_4F_9SO_2)_2N^-$, and the like.

As the monovalent polyatomic anion, in addition to an anion represented by $MY_a^-$, $(Rf)_bPF_{6-b}^-$, $R^{x1}_cBY_{4-c}^-$, $R^{x1}_cGaY_{4-c}^-$, $R^{x2}SO_3^-$, $(R^{x2}SO_2)_3C^-$ or $(R^{x2}SO_2)_2N^-$, perhalogenate ions (such as $ClO_4^-$ and $BrO_4^-$), halogenated sulfonate ions (such as $FSO_3^-$ and $ClSO_3^-$), sulfate ions (such as $CH_3SO_4^-$, $CF_3SO_4^-$ and $HSO_4^-$), carbonate ions (such as $HCO_3^-$ and $CH_3CO_3^-$), aluminate ions (such as $AlCl_4^-$ and $AlF_4^-$), hexafluoro bismuthate ion ($BiF_6^-$), carboxylate ions (such as $CH_3COO^-$, $CF_3COO^-$, $C_6H_5COO^-$, $CH_3C_6H_4COO^-$, $C_6F_5COO^-$ and $CF_3C_6H_4COO^-$), aryl borate ions (such as $B(C_6H_5)_4^-$ and $CH_3CH_2CH_2CH_2B(C_6H_5)_3^-$), thiocyanate ion ($SCN^-$), and nitrate ion ($NO_3^-$), and the like can be used.

Among these $X^-$, anions represented by $MY_a^-$, $(Rf)_bPF_{6-b}^-$, $R^{x1}_cBY_{4-c}^-$, $R^{x1}_cGaY_{4-c}^-$ and $(R^{x2}SO_2)_3C^-$ are preferred, $SbF_6^-$, $PF_6^-$, $(CF_3CF_2)_3PF_3^-$, $(C_6F_5)_4B^-$, $((CF_3)_2C_6H_3)_4B^-$, $(C_6F_5)_4Ga^-$, $((CF_3)_2C_6H_3)_4Ga^-$ and $(CF_3SO_2)_3C^-$ are more preferred, and $R^{x1}_cBY_{4-c}^-$ is further preferred from the viewpoint of cationic polymerization performance.

Examples of the aromatic hydrocarbon ring in the above formulae (c2), (c5) and (c6) include a benzene ring, condensed polycyclic aromatic hydrocarbon rings [for example, condensed di- to tetracyclic aromatic hydrocarbon rings such as condensed dicyclic hydrocarbon rings (for example $C_{8-20}$ condensed dicyclic hydrocarbon rings such as a naphthalene ring, preferably $C_{10-16}$ condensed dicyclic hydrocarbon rings) and condensed tricyclic aromatic hydrocarbon rings (for example, an anthracene ring, a phenanthrene ring, etc.)] and the like. The aromatic hydrocarbon ring is preferably a benzene ring or a naphthalene ring, more preferably a benzene ring.

Examples of the halogen atom in the above formulae (c1) to (c6) include a fluorine atom, a chlorine atom, a bromine atom and an iodine atom, and the like.

Examples of the alkyl group in the above formulae (c1) to (c6) include linear alkyl groups having 1 or more and 18 or less carbon atoms (such as methyl, ethyl, n-propyl, n-butyl, n-pentyl, n-octyl, n-decyl, n-dodecyl, n-tetradecyl, n-hexadecyl and n-octadecyl), branched alkyl groups having 3 or more and 18 or less carbon atoms (such as isopropyl, isobutyl, sec-butyl, tert-butyl, isopentyl, neopentyl, tert-pentyl, isohexyl and isooctadecyl), and cycloalkyl groups having 3 or more and 18 or less carbon atoms (such as cyclopropyl, cyclobutyl, cyclopentyl, cyclohexyl and 4-decylcyclohexyl), and the like. In particular, the alkyl group optionally substituted with a halogen atom in the above formulae (c1), (c2) and (c4) to (c6) means an alkyl group and an alkyl group substituted with a halogen atom. Examples of the alkyl group substituted with a halogen atom include groups in which at least one hydrogen atom in the above linear alkyl groups, branched alkyl groups or cycloalkyl groups is substituted with a halogen atom (such as monofluoromethyl, difluoromethyl and trifluoromethyl), and the like. Among the alkyl groups optionally substituted with a halogen atom, $R^{c1}$, $R^{c2}$, $R^{c9}$ or $R^{c10}$ is particularly preferably a trifluoromethyl group, and $R^{c4}$, $R^{c6}$, $R^{c11}$ or $R^{c12}$ is particularly preferably a methyl group.

Examples of the alkoxy group in the above formulae (c2) to (c6) include linear or branched alkoxy groups having 1 or more and 18 or less carbon atoms (such as methoxy, ethoxy, propoxy, isopropoxy, butoxy, isobutoxy, sec-butoxy, tert-butoxy, hexyloxy, decyloxy, dodecyloxy and octadecyloxy), and the like.

Examples of the alkyl group in the alkylcarbonyl group in the above formulae (c2) to (c6) include the above linear alkyl groups having 1 or more and 18 or less carbon atoms, branched alkyl groups having 3 or more and 18 or less carbon atoms, or cycloalkyl groups having 3 or more and 18 or less carbon atoms, and examples of the alkylcarbonyl group include linear, branched or cyclic alkylcarbonyl groups having 2 or more and 18 or less carbon atoms (such as acetyl, propionyl, butanoyl, 2-methylpropionyl, heptanoyl, 2-methylbutanoyl, 3-methylbutanoyl, octanoyl, decanoyl, dodecanoyl, octadecanoyl, cyclopentanoyl and cyclohexanoyl), and the like.

Examples of the arylcarbonyl group in the above formulae (c3) to (c6) include arylcarbonyl groups having 7 or more and 11 or less carbon atoms (such as benzoyl and naphthoyl), and the like.

Examples of the alkoxycarbonyl group in the above formulae (c2) to (c6) include linear or branched alkoxycarbonyl groups having 2 or more and 19 or less carbon atoms (such as methoxycarbonyl, ethoxycarbonyl, propoxycarbonyl, isopropoxycarbonyl, butoxycarbonyl, isobutoxycarbonyl, sec-butoxycarbonyl, tert-butoxycarbonyl, octyloxycarbonyl, tetradecyloxycarbonyl and octadecyloxycarbonyl), and the like.

Examples of the aryloxycarbonyl group in the above formulae (c3) to (c6) include aryloxycarbonyl groups having 7 or more and 11 or less carbon atoms (such as phenoxycarbonyl and naphthoxycarbonyl), and the like.

Examples of the arylthiocarbonyl group in the above formulae (c3) to (c6) include arylthiocarbonyl groups having 7 or more and 11 or less carbon atoms (such as phenylthiocarbonyl and naphthoxythiocarbonyl), and the like.

Examples of the acyloxy group in the above formulae (c2) to (c6) include linear or branched acyloxy groups having 2 or more and 19 or less carbon atoms (such as acetoxy, ethylcarbonyloxy, propylcarbonyloxy, isopropylcarbonyloxy, butylcarbonyloxy, isobutylcarbonyloxy, sec-butylcarbonyloxy, tert-butylcarbonyloxy, octylcarbonyloxy, tetradecylcarbonyloxy and octadecylcarbonyloxy), and the like.

Examples of the arylthio group in the above formulae (c3) to (c6) include arylthio groups having 6 or more and 20 or less carbon atoms (such as phenylthio, 2-methylphenylthio, 3-methylphenylthio, 4-methylphenylthio, 2-chlorophenylthio, 3-chlorophenylthio, 4-chlorophenylthio, 2-bromophenylthio, 3-bromophenylthio, 4-bromophenylthio, 2-fluorophenylthio, 3-fluorophenylthio, 4-fluorophenylthio, 2-hydroxyphenylthio, 4-hydroxyphenylthio, 2-methoxyphenylthio, 4-methoxyphenylthio, 1-naphthylthio, 2-naphthylthio, 4-[4-(phenylthio)benzoyl]phenylthio, 4-[4-(phenylthio)phenoxy]phenylthio, 4-[4-(phenylthio)phenyl] phenylthio, 4-(phenylthio)phenylthio, 4-benzoylphenylthio, 4-benzoyl-2-chlorophenylthio, 4-benzoyl-3-chlorophenylthio, 4-benzoyl-3-methylthiophenylthio, 4-benzoyl-2-methylthiophenylthio, 4-(4-methylthiobenzoyl)phenylthio, 4-(2-methylthiobenzoyl)phenylthio, 4-(p-methylbenzoyl)phenylthio, 4-(p-ethylbenzoyl)phenylthio, 4-(p-isopropylbenzoyl)phenylthio and 4-(p-tert-butylbenzoyl)phenylthio), and the like.

Examples of the alkylthio group in the above formulae (c2) to (c6) include linear or branched alkylthio groups having 1 or more and 18 or less carbon atoms (such as methylthio, ethylthio, propylthio, isopropylthio, butylthio, isobutylthio, sec-butylthio, tert-butylthio, pentylthio, isopentylthio, neopentylthio, tert-pentylthio, octylthio, decylthio, dodecylthio and isooctadecylthio), and the like.

Examples of the aryl group in the above formulae (c3) to (c6) include aryl groups having 6 or more and 10 or less carbon atoms (such as phenyl, tolyl, dimethylphenyl and naphthyl), and the like.

Examples of the heterocyclic aliphatic group in the above formula (c2) include heterocyclic groups having 2 or more and 20 or less (preferably 4 or more and 20 or less) carbon atoms (such as pyrrolidinyl, tetrahydrofuranyl, tetrahydrothienyl, piperidinyl, tetrahydropyranyl, tetrahydrothiopyranyl and morpholinyl) and the like.

Examples of the heterocyclic group in the above formulae (c3) to (c6) include heterocyclic groups having 4 or more and 20 or less carbon atoms (such as thienyl, furanyl, selenophenyl, pyranyl, pyrrolyl, oxazolyl, thiazolyl, pyridyl, pyrimidyl, pyrazinyl, indolyl, benzofuranyl, benzothienyl, quinolyl, isoquinolyl, quinoxalinyl, quinazolinyl, carbazolyl, acridinyl, phenothiazinyl, phenazinyl, xanthenyl, thianthrenyl, phenoxazinyl, phenoxathiinyl, chromanyl, isochromanyl, dibenzothienyl, xanthonyl, thioxanthonyl and dibenzofuranyl), and the like.

Examples of the aryloxy group in the above formulae (c3) to (c6) include aryloxy groups having 6 or more and 10 or less carbon atoms (such as phenoxy and naphthyloxy) and the like.

Examples of the alkylsulfinyl group in the above formulae (c2) to (c6) include linear or branched sulfinyl groups having 1 or more and 18 or less carbon atoms (such as methylsulfinyl, ethylsulfinyl, propylsulfinyl, isopropylsulfinyl, butylsulfinyl, isobutylsulfinyl, sec-butylsulfinyl, tert-butylsulfinyl, pentylsulfinyl, isopentylsulfinyl, neopentylsulfinyl, tert-pentylsulfinyl, octylsulfinyl and isooctadecylsulfinyl), and the like.

Examples of the arylsulfinyl group in the above formulae (c3) to (c6) include arylsulfinyl groups having 6 or more and 10 or less carbon atoms (such as phenylsulfinyl, tolylsulfinyl and naphthylsulfinyl), and the like.

Examples of the alkylsulfonyl group in the above formulae (c2) to (c6) include linear or branched alkylsulfonyl groups having 1 or more and 18 or less carbon atoms (such as methylsulfonyl, ethylsulfonyl, propylsulfonyl, isopropylsulfonyl, butylsulfonyl, isobutylsulfonyl, sec-butylsulfonyl, tert-butylsulfonyl, pentylsulfonyl, isopentylsulfonyl, neopentylsulfonyl, tert-pentylsulfonyl, octylsulfonyl and octadecylsulfonyl), and the like.

Examples of the arylsulfonyl group in the above formulae (c3) to (c6) include arylsulfonyl groups having 6 or more and 10 or less carbon atoms (such as phenylsulfonyl, tolylsulfonyl (a tosyl group) and naphthylsulfonyl), and the like.

Examples of the hydroxy(poly)alkyleneoxy group in the above formulae (c2) to (c6) include a hydroxy(poly)alkyleneoxy group represented by $HO(AO)_q^-$ (wherein AO independently represents an ethyleneoxy group and/or a propyleneoxy group, and q represents an integer of 1 or more and 5 or less), and the like.

Examples of the optionally substituted amino group in the above formulae (c2) to (c6) include an amino group (—$NH_2$) and substituted amino groups having 1 or more and 15 or less carbon atoms (such as methylamino, dimethylamino, ethylamino, methylethylamino, diethylamino, n-propylamino, methyl-n-propylamino, ethyl-n-propylamino, n-propylamino, isopropylamino, isopropylmethylamino, isopropylethylamino, diisopropylamino, phenylamino, diphenylamino, methylphenylamino, ethylphenylamino, n-propylphenylamino and isopropylphenylamino), and the like.

Examples of the alkylene group in the above formulae (c3) and (c4) include linear or branched alkylene groups having 1 or more and 18 or less carbon atoms (such as a methylene group, a 1,2-ethylene group, a 1,1-ethylene group, a propane-1,3-diyl group, a propane-1,2-diyl group, a propane-1,1-diyl group, a propane-2,2-diyl group, a butane-1,4-diyl group, a butane-1,3-diyl group, a butane-1,2-diyl group, a butane-1,1-diyl group, a butane-2,2-diyl group, a butane-2,3-diyl group, a pentane-1,5-diyl group, a pentane-1,4-diyl group, a hexane-1,6-diyl group, a heptane-1,7-diyl group, an octane-1,8-diyl group, a 2-ethylhexane-1,6-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group and a hexadecane-1,16-diyl group), and the like.

The sulfonium salt (Q) can be synthesized, for example, according to the following scheme. Specifically, 1-fluoro-2-methyl-4-nitrobenzene represented by the following formula (C1) is allowed to react with a compound represented by the following formula (C2) in the presence of a base such as potassium hydroxide to obtain a nitro compound represented by the following formula (C3), which is then reduced in the presence of reduced iron to obtain an amine compound represented by the following formula (C4). This amine compound and a nitrite (for example, sodium nitrite) represented by $MaNO_2$ (wherein Ma represents a metal atom, for example an alkali metal atom such as a sodium atom) are allowed to react to obtain a diazo compound, which is then mixed with a cuprous halide represented by CuX' (wherein X' represents a halogen atom such as a bromine atom; the same applies hereinafter) and a hydrogen halide represented by HX', and reaction is allowed to proceed to obtain a halide represented by the following formula (C5). Grignard reagent is prepared from this halide and magnesium, and a sulfonium salt represented by the following formula (C7) can be then obtained by the reaction of this Grignard reagent and a sulfoxide compound represented by the following formula (C6) in the presence of chlorotrimethylsilane. Furthermore, this sulfonium salt is allowed to react with a salt represented by $Mb^+X'''^-$ (wherein $Mb^+$ represents a metal cation, for example an alkali metal cation such as a potassium ion and $X'''^-$ represents a monovalent anion represented by $X^-$ (excluding halogen anions)) to carry out salt conversion, and a sulfonium salt represented by the following formula (C8) can be obtained thereby. In the following formulae (C2) to (C8), $R^{c1}$ to $R^{c3}$ and $A^{c1}$ are the same as those of the above formula (c1).

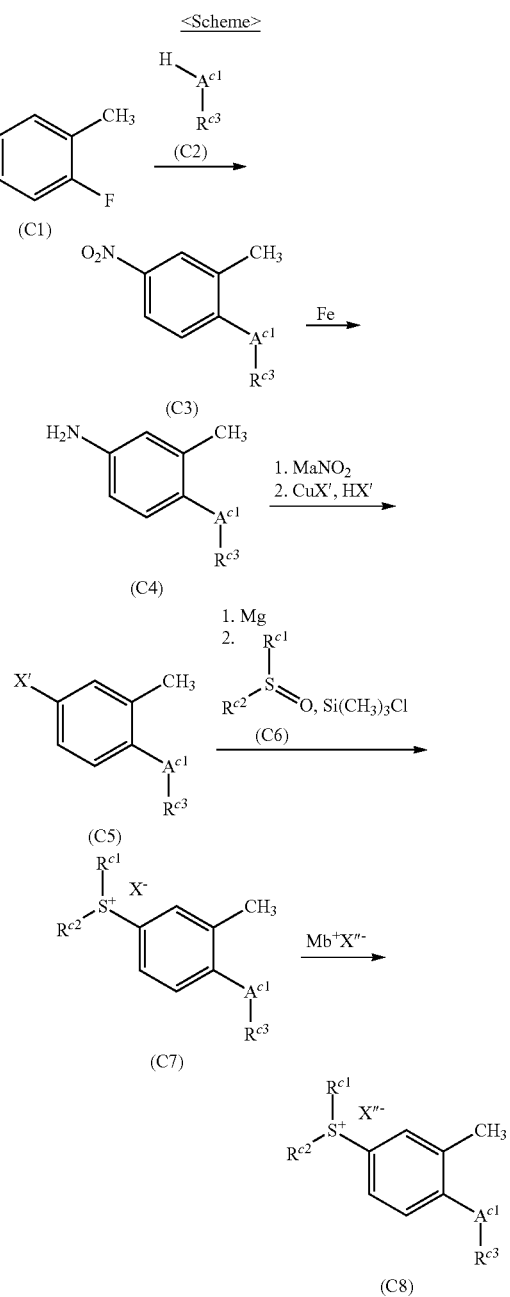

Specific examples of the cation portion of the sulfonium salt (Q) represented by the above formula (c1) are given below. Specific examples of the anion portion of the sulfonium salt (Q) represented by the above formula (c1) can include conventionally known anions such as anions mentioned in the above description of $X^-$. The sulfonium salt (Q) represented by the above formula (c1) can be synthesized according to the above scheme, and the cation portion can be combined with a desired anion portion by further salt conversion as needed. In particular, a combination with an anion represented by $R^{x1}{}_cBY_{4-c}{}^-$ (wherein $R^{x1}$ represents a phenyl group in which at least part of hydrogen atoms is substituted with a halogen atom or an electron withdrawing group; Y represents a halogen atom; and c represents an integer of 1 or more and 4 or less) is preferred.

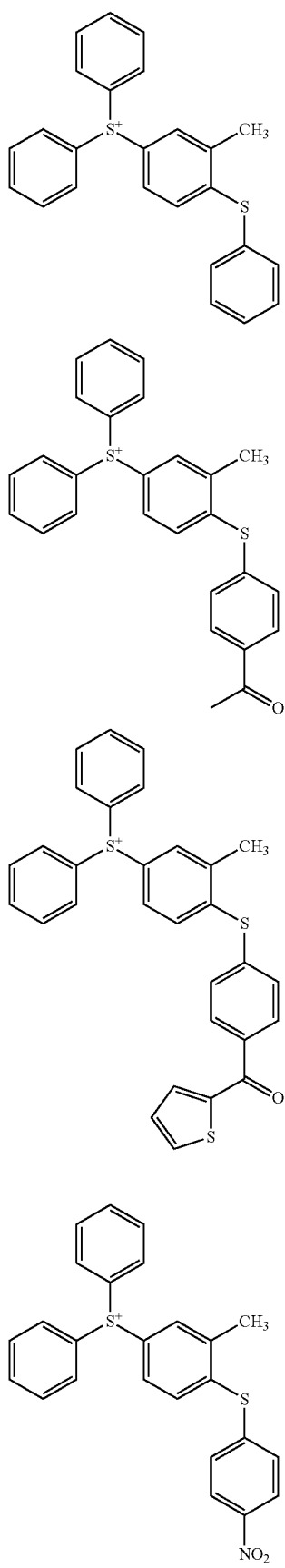
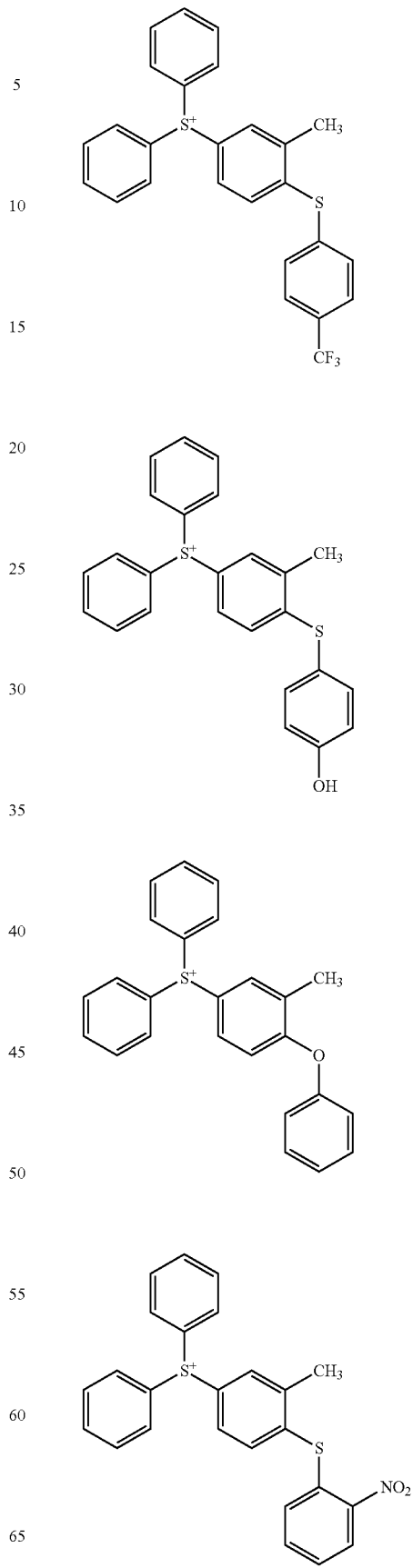

-continued

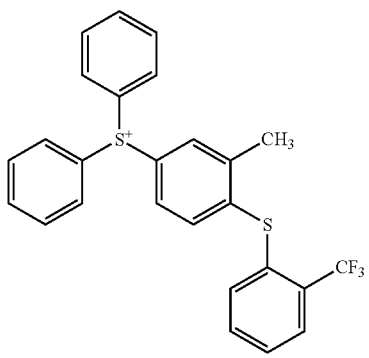

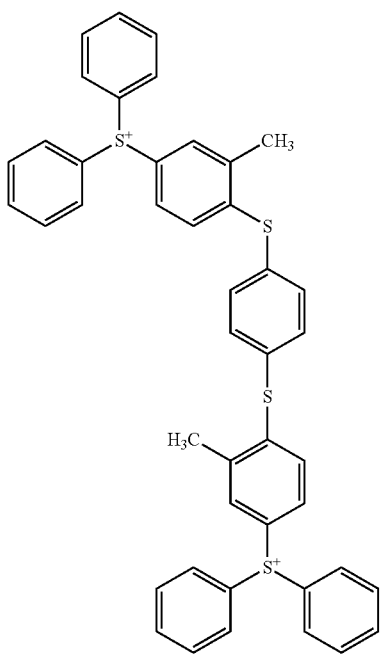

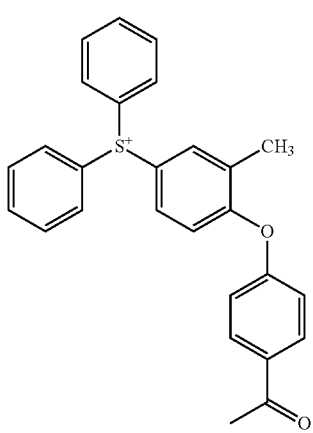

-continued

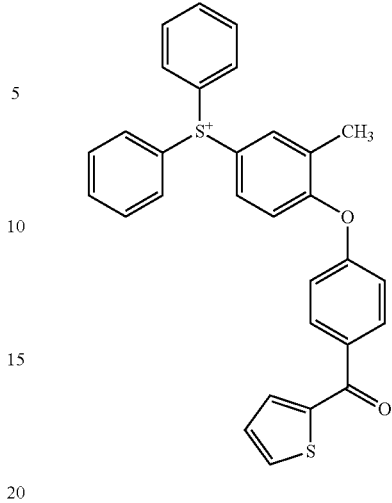

Among the group of the above preferred cation portions, a cation portion represented by the following formula is more preferred.

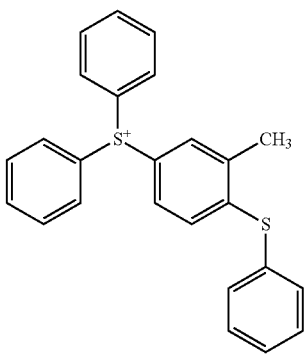 [SMILES: Cc1cc([S+](c2ccccc2)c2ccccc2)ccc1Sc1ccccc1]

When the acid generator (C) includes the above sulfonium salt (Q), the acid generator (C) may include other acid generators other than the sulfonium salt (Q) together with agents other than the above sulfonium salt (Q). In this case, the sulfonium salt (Q) content in the acid generator (C) is not particularly limited, and typically is preferably 70% by mass or more, more preferably 80% by mass or more, particularly preferably 90% by mass or more, most preferably 100% by mass. When the curable composition includes the onium salt including the gallate anion and/or borate anion as the acid generator (C), the cation portion of the onium salt is not limited to the cation portion of the sulfonium cation represented by the above formula (c1). The onium salt can be an onium salt including a cation portion exemplified in other acid generators described below. When the curable composition includes the onium salt including the gallate anion and/or borate anion as the acid generator (C), excellent effect of the present invention can be obtained. When the curable composition includes the onium salt including the gallate anion and/or borate anion as the acid generator (C), the content of the onium salt is not particularly limited. Typically, the content is preferably 70% by mass or more, particularly preferably 90% by mass or more and most preferably 100% by mass.

(Other Acid Generators)

As other acid generators other than the sulfonium salt (Q), various acid generators which have conventionally used to cure an epoxy compound can be used without particular limitation. Other acid generators are preferably onium salts such as an iodonium salt and a sulfonium salt, and more preferably other sulfonium salts other than the sulfonium salt (Q).

Hereinafter, other sulfonium salts other than the sulfonium salt (Q) are also referred to as "sulfonium salt (Q')". Other sulfonium salts (Q') preferably include the anion represented by $R^{x1}{}_c BY_{4-c}{}^-$ described above or the anion represented by $R^{x1}{}_c GaY_{4-c}{}^-$ described above as the monovalent anion X⁻, as in the case of the sulfonium salt (Q).

Examples of the sulfonium salt (Q') having the monovalent anion represented by $R^{x1}{}_c BY_{4-c}{}^-$ include a sulfonium salt represented by the following formula (c1'), for example: The sulfonium salt (Q') having the monovalent anion represented by $R^{x1}{}_c GaY_{4-c}{}^-$ is a sulfonium salt in which B in the following formula (c1') is substituted with Ga.

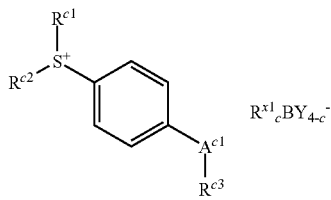
(c1')

In the formula, $R^{c1}$, $R^{c2}$, $R^{c3}$, $A^{c1}$, $R^{x1}$, Y, and c are the same as defined above.

Specific examples of the cation portion of the sulfonium salt (Q') represented by the above formula (c1') include the following cations.

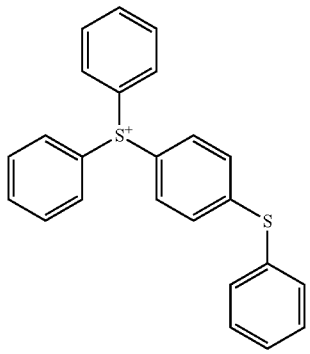

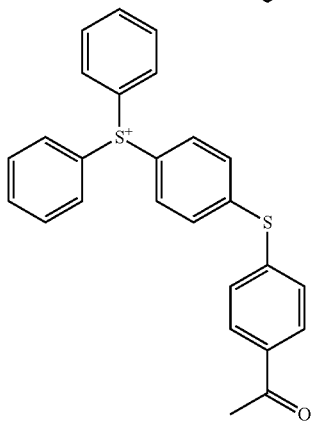

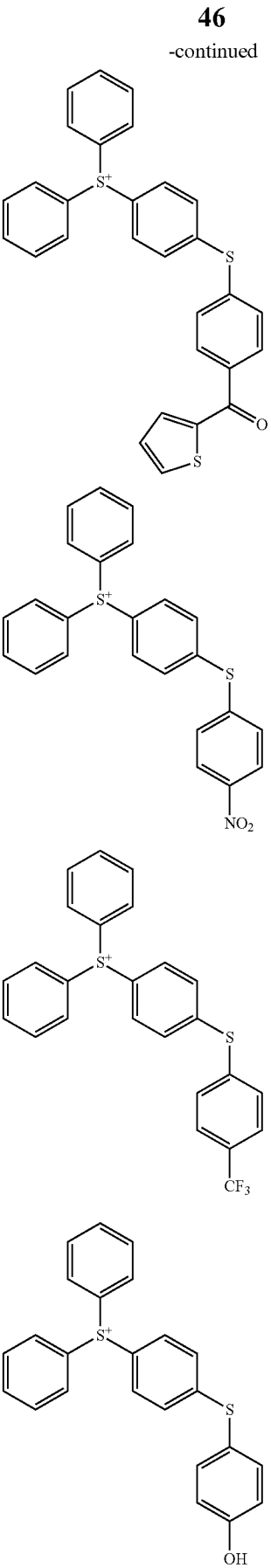

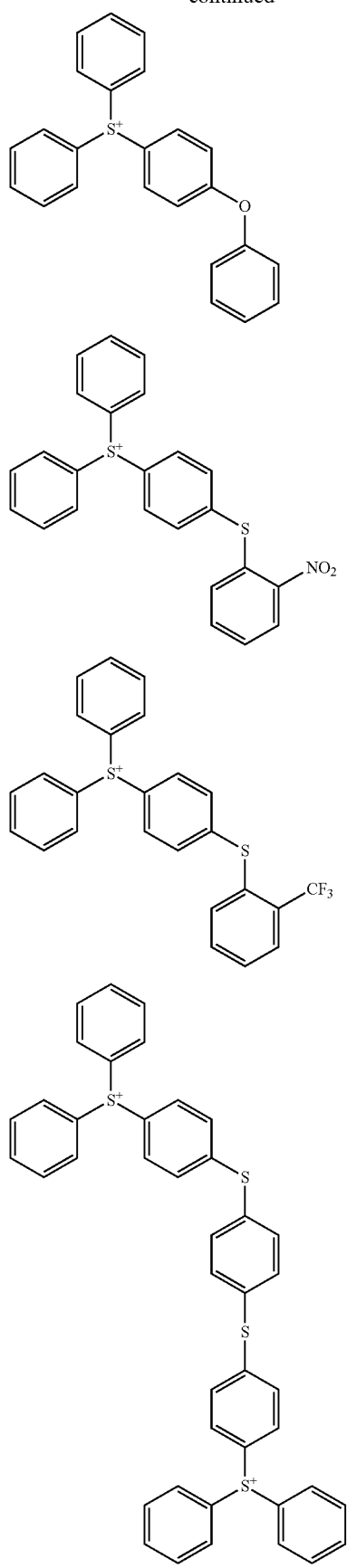
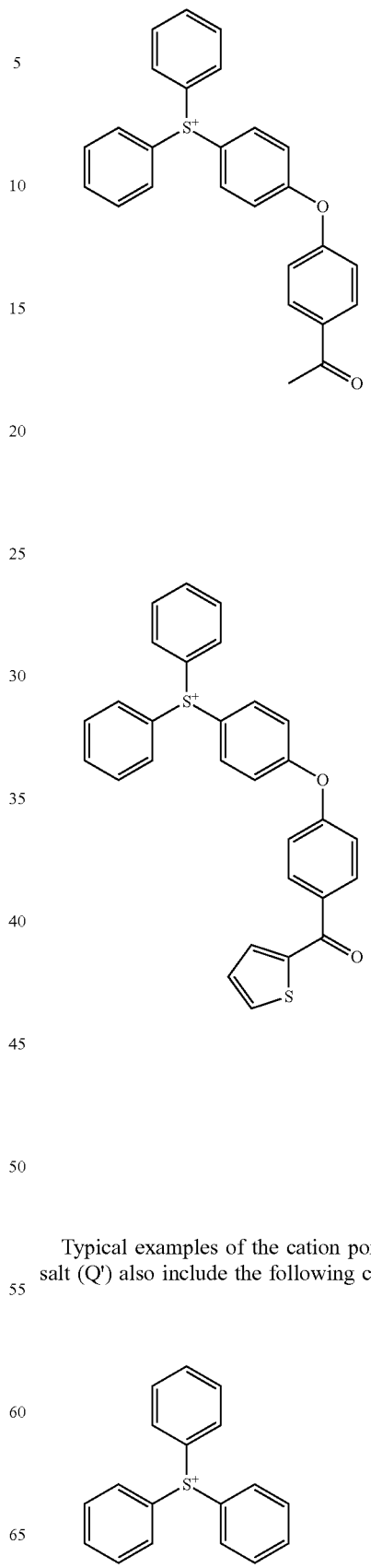
Typical examples of the cation portion of the sulfonium salt (Q') also include the following cation.

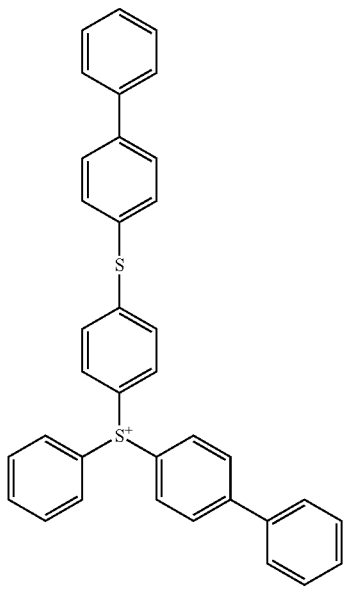
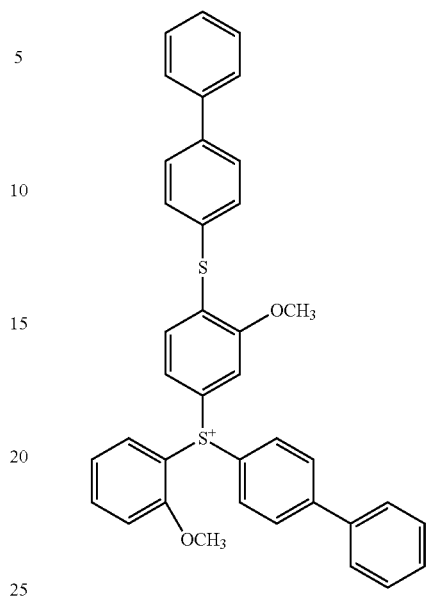
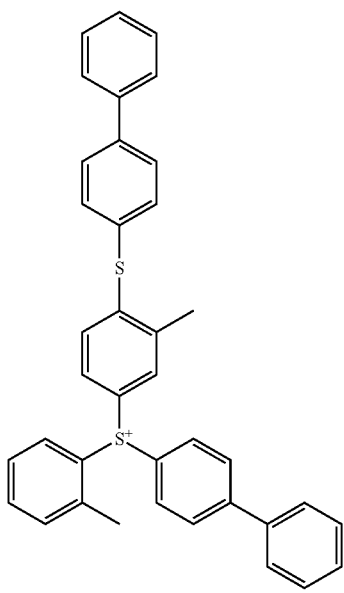
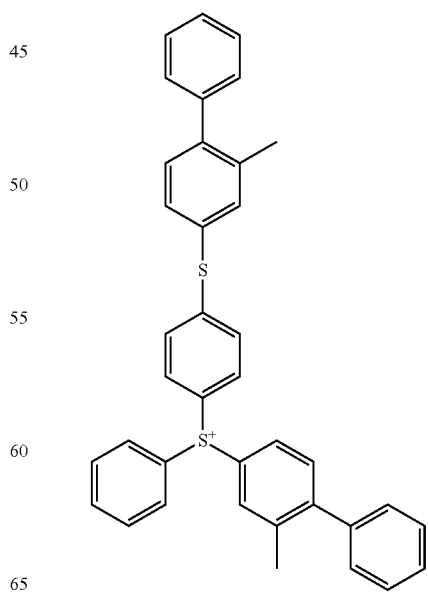

51
-continued
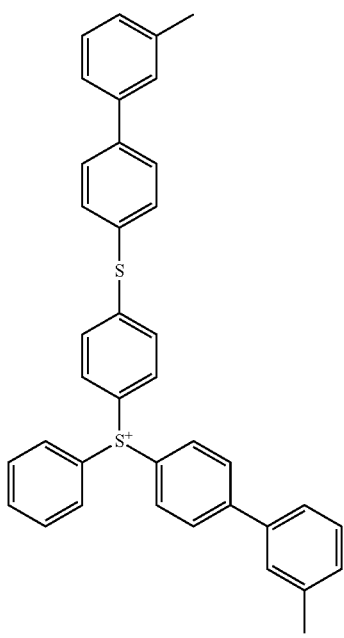
52
-continued
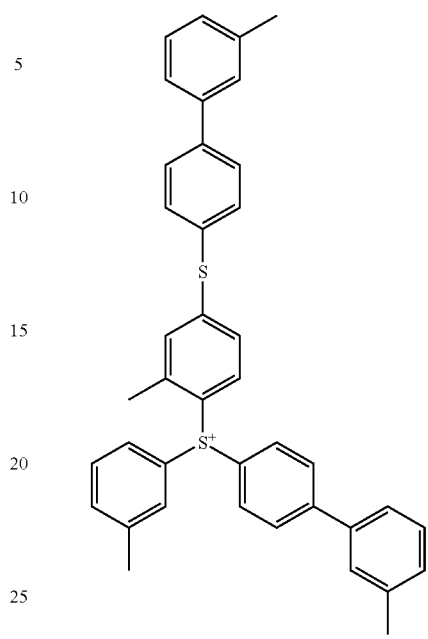
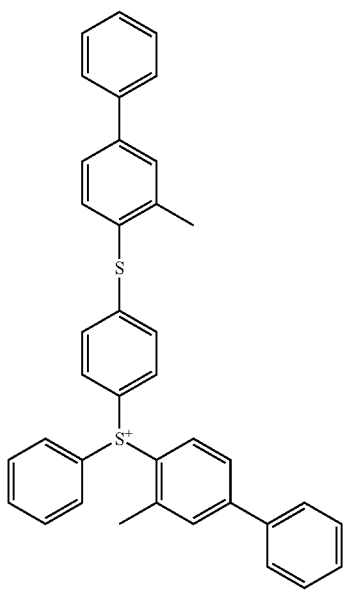
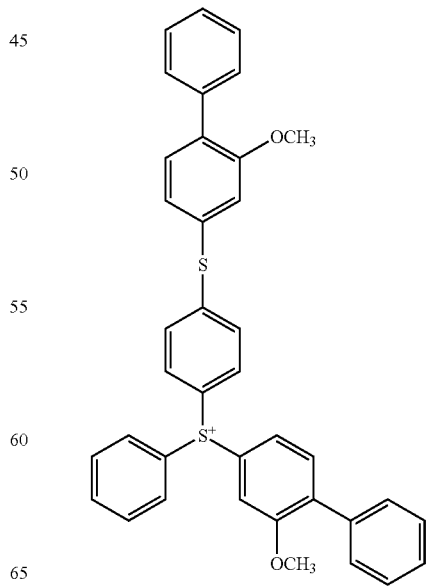

53
-continued
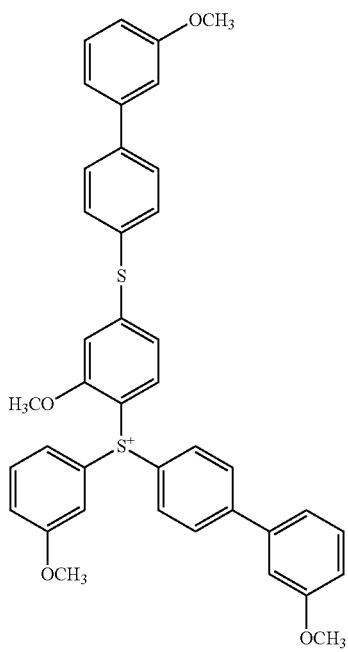
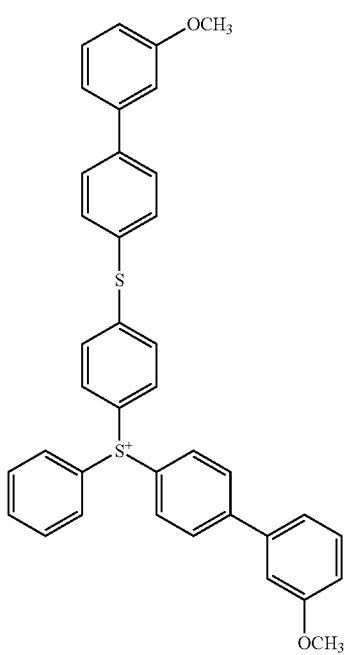
54
-continued
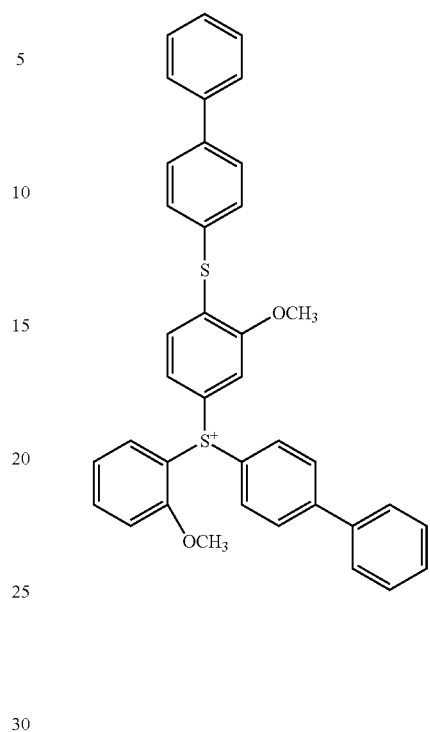
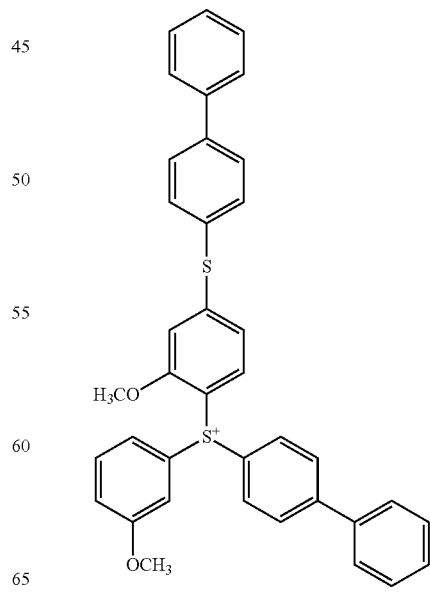

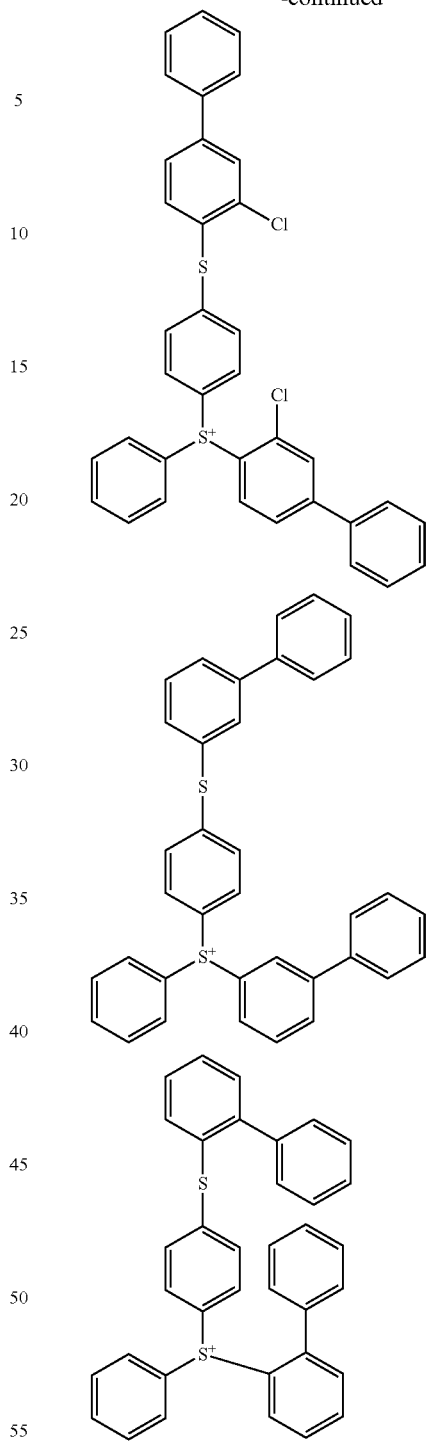

The content of the acid generator (C) in the curable composition is not particularly limited as long as the curing of the curable composition proceeds well. The content is typically preferably 0.01 parts by mass or more and 5 parts by mass or less, more preferably 0.05 parts by mass or more and 4 parts by mass or less, and particularly preferably 0.1 parts by mass or more and 3 parts by mass or less with respect to 100 parts by mass of epoxy compound (A) from the viewpoint that the curable composition is easily cured well.

<Sensitizing Agent (D)>

The curable composition may include a sensitizing agent (D). As the sensitizing agent, known sensitizing agents which have been conventionally used in combination with various acid generators can be used without particular limitation. Specific examples of the sensitizing agent include anthracene compounds such as anthracene, 9,10-dibutoxyanthracene, 9,10-dimethoxyanthracene, 9,10-diethoxyanthracene, 2-ethyl-9,10-dimethoxyanthracene and 9,10-dipropoxyanthracene; pyrene; 1,2-benzanthracene; perylene; tetracene; coronene; thioxanthone compounds such as thioxanthone, 2-methylthioxanthone, 2-ethylthioxanthone, 2-chlorothioxanthone, 2-isopropylthioxanthone and 2,4-diethylthioxanthone; phenothiazine compounds such as phenothiazine, N-methylphenothiazine, N-ethylphenothiazine and N-phenylphenothiazine; xanthone; naphthalene compounds such as 1-naphthol, 2-naphthol, 1-methoxynaphthalene, 2-methoxynaphthalene, 1,4-dihydroxynaphthalene and 4-methoxy-1-naphthol; ketones such as dimethoxyacetophenone, diethoxyacetophenone, 2-hydroxy-2-methyl-1-phenylpropan-1-one, 4'-isopropyl-2-hydroxy-2-methylpropiophenone and 4-benzoyl-4'-methyldiphenyl sulfide; carbazole compounds such as N-phenylcarbazole, N-ethylcarbazole, poly-N-vinylcarbazole and N-glycidylcarbazole; chrysene compounds such as 1,4-dimethoxychrysene and 1,4-di-α-methylbenzyloxychrysene; phenanthrene compounds such as 9-hydroxyphenanthrene, 9-methoxyphenanthrene, 9-hydroxy-10-methoxyphenanthrene and 9-hydroxy-10-ethoxyphenanthrene. Two or more of these sensitizing agents may be used in combination.

The amount of sensitizing agent (D) used is not particularly limited and is preferably 1 part by mass or more and 300 parts by mass or less, more preferably 5 parts by mass or more and 200 parts by mass or less with respect to 100 parts by mass of acid generator (C). When the sensitizing agent (D) is used within such range, a desired sensitizing action is easily obtained.

<Solvent (S)>

The curable composition may include a solvent (S) as needed for the purpose of adjusting coating properties and film forming properties. As the solvent (S), solvents which have conventionally combined in various curable compositions can be used without particular limitation as long as the object of the present invention is not inhibited. The solvent (S) may be included as a combination of two or more solvents.

Specific preferred examples of the solvent (S) include alcohols such as methanol, ethanol, propanol and n-butanol; polyalcohols such as ethylene glycol, diethylene glycol, propylene glycol and dipropylene glycol; ketones such as acetone, methylethylketone, cyclohexane, methyl-n-amylketone, methylisoamylketone and 2-heptanone; lactone ring-containing organic solvents such as γ-butyrolactone; derivatives of polyalcohols such as a compound having an ester bond such as ethylene glycol monoacetate, diethylene glycol monoacetate, propylene glycol monoacetate or dipropylene glycol monoacetate, and a compound having an ether bond such as a monoalkyl ether, e.g. monomethyl ether, monoethyl ether, monopropyl ether or monobutyl ether, or monophenyl ether of the polyalcohols or the compound having an ether bond; cyclic ethers such as dioxane; esters such as methyl lactate, ethyl lactate, methyl acetate, ethyl acetate, butyl acetate, cyclopropyl acetate, cyclobutyl acetate, methyl pyruvate, ethyl pyruvate, methyl methoxypropionate and ethyl ethoxypropionate; aromatic organic solvents such as anisole, ethyl benzyl ether, cresyl methyl ether, diphenyl ether, dibenzyl ether, phenetol, butylphenyl ether, ethylbenzene, diethylbenzene, amylbenzene, isopropylbenzene, toluene, xylene, cymene and mesitylene; and nitrogen-containing organic solvents such as N,N,N',N'-tetramethylurea, N,N,2-trimethylpropionamide, N,N-dimethylacetamide, N,N-dimethylformamide, N,N-diethylacetamide, N,N-diethylformamide, 1,3-dimethyl-2-imidazolidinone, N-methylpyrrolidone and N-ethylpyrrolidone.

Among the above solvents, propyleneglycol monomethylether acetate (PGMEA), propyleneglycol monomethylether (PGME), N,N,N',N'-tetramethylurea and butanol are preferred as the solvent (S).

The amount of solvent (S) used is not particularly limited as long as the object of the present invention is not inhibited. The solvent (S) is used so that the concentration of components other than the solvent (S) in the curable composition is preferably 1% by mass or more and 50% by mass or less, more preferably 10% by mass or more and 40% by mass or less from the viewpoint of film-forming properties.

<Other Components>

Examples of other components include a base generator, a catalyst, a silane coupling agent, an adhesion enhancer, a dispersant, a surface active agent, an ultraviolet absorber, an antioxidant, a defoaming agent, a viscosity modifier, resin, rubber particles and a colorant and the like. It should be noted that when the curable composition includes an alkali soluble resin as a resin, alkali development properties are imparted to the curable composition. In addition, when the curable composition includes rubber particles, elasticity is imparted to a cured film and brittleness of the cured film is easily solved.

<<Method of Producing Curable Composition>>

By uniformly mixing the components described above at a predetermined ratio, a curable composition can be produced. Examples of mixing apparatus which can be used to produce the curable composition include a twin roll, a triple roll and the like. When the viscosity of the curable composition is low enough, the curable composition may be filtered using a filter with a desired aperture size, as needed, to remove insoluble foreign matter.

<<Method of Producing Cured Product>>

The method of producing a cured product is not particularly limited, as long as the method can cure a curable composition that has been shaped into a desired shape. The method of curing is not particularly limited, and may be either heating or light exposure, and may be a combination of heating and light exposure.

The shape of the shaped product is not particularly limited, and is preferably a film. A film made of a cured product of the curable composition, obtained by curing a shaped product in the form of film is suitably used as an optical film for a light-emitting display element.

A typical example of the method of producing a cured product as a film will be described below. The film may be directly formed on various functional layers in e.g. a laminated body and light-emitting display element panel, or a film formed on a substrate having an optional material such as a metal substrate or a glass substrate is released from the substrate and may be used.

First, the curable composition is coated on e.g. any substrate or a functional layer to form a coating film. Examples of the coating method include methods in which a contact transfer-type applicator such as a roll coater, a reverse coater or a bar coater, and a non-contact type applicator such as a spinner (a rotary applicator), a slit coater, or a curtain flow coater are used. After adjusting the viscosity of the curable composition within an appropriate range, the curable composition may be coated by a printing method such as ink-jet printing or screen printing to form a coating film which is patterned into a desired shape.

Then, a volatile component such as the solvent (S) is removed as needed to dry the coating film. The method of drying is not particularly limited, and examples thereof include a method in which the coating film is dried under reduced pressure at room temperature using a vacuum dryer (VCD) and then dried on a hot plate at a temperature of 60° C. or higher and 120° C. or lower, preferably 70° C. or higher and 100° C. or lower, for 60 seconds or longer and 180 seconds or shorter. After forming the coating film in this manner, the coating film is subjected to light exposure and/or heating. Light exposure is carried out by irradiation with active energy rays such as excimer laser light. The dose of energy irradiated varies depending on the composition of the curable composition, and is for example preferably 30 mJ/cm$^2$ or more and 2000 mJ/cm$^2$ or less, and more preferably 50 mJ/cm$^2$ or more and 500 mJ/cm$^2$ or less. The temperature for heating is not particularly limited, and is preferably 180'C or higher and 280'C or lower, more preferably 200'C or higher and 260° C. or lower, and particularly preferably 220° C. or higher and 250° C. or lower. The heating time is typically preferably 1 minute or longer and 60 minutes or shorter, more preferably 10 minutes or longer and 50 minutes or shorter, and particularly preferably 20 minutes or longer and 40 minutes or shorter.

The film thickness of the cured film is not particularly limited. The film thickness of the cured film is typically 0.1 μm or more and 10 μm or less, preferably 0.2 μm or more and 5 μm or less, and more preferably 0.5 μm or more and 3 μm or less.

A film including quantum dots (B) formed by the method described above can be suitably used as an optical film for a light-emitting display element because of good fluorescence efficiency, and also can be suitably used to produce a laminated body suitably used in a light-emitting display element.

<<Laminated Body>>

The laminated body is a laminated body including the above-described film made of a cured product of the curable composition. Such laminated body can be a laminated body made of only a film including quantum dots (B), or a laminated body made of a film including quantum dots (B) and another functional layer.

<Laminated Body of Film Including Quantum Dots>

As the laminated body, for example, two or more films including quantum dots (B) dispersed in various matrix materials are laminated, and examples of the laminated body include a laminated body including one or more of the above-described film made of a cured product of the curable composition. Such laminated body may be a laminated body in which only films made of a cured product of the curable composition are laminated, or a laminated body in which a film made of a cured product of the curable composition, and another film including quantum dots (B) other than the film made of a cured product of the curable composition are laminated.

Examples of another film include a film in which quantum dots (B) are dispersed in one or more matrix materials selected from a cured product of an epoxy compound which does not correspond to the above-described epoxy compound (A), acrylic resin (for example, poly methyl (meth) acrylate and poly butyl (meth)acrylate and the like), norbornene resin, polyolefin (for example polyethylene), polyvinylbutyral, polyvinyl acetate, polyurea, polyurethane, polyester resin (for example, polyethylene terephthalate), and polycarbonate resin and the like.

When a plurality of films including quantum dots (B) are laminated to produce a laminated body, it is preferred that the refractive indices of adjacent films be different. In addition, it is preferred that a high refractive index film with a high refractive index and a low refractive index film with a low refractive index be alternately laminated. In this case, it is preferred that a difference in the refractive index between adjacent films be 0.4 or more and 2.0 or less. In a case where a plurality of films having different refractive indices are repeatedly laminated, when incident light rays from a light source pass through a laminated body, the use efficiency of incident light is easily increased by radiation of light rays by refraction.

It is preferred that a film including quantum dots (B) include quantum dots producing red light by wavelength conversion of incident light from a light source, and quantum dots producing green light by wavelength conversion of incident light from a light source. It is also preferred that a film including quantum dots producing red light and a film including quantum dots producing green light be alternately laminated. When a laminated body having such structure is applied to a light-emitting display element panel, because green light and red light having high color purity can be extracted by wavelength conversion, the range of hue reproduction in a light-emitting display equipped with the light-emitting display element panel can be enlarged. It should be noted that blue light and white light can be typically used as a light source. Red light, green light and blue light having high color purity can be extracted by using such light source in combination with the above laminated body, and a clear image with good hues can be shown.

The light-emitting display is not particularly limited as long as it is a device to show an image using light emission of a light source, and examples thereof include a liquid crystal display, an organic EL display and the like.

<Laminated Body Including Film Including Quantum Dots (B) and Another Functional Layer>

It is also preferred that the above-described film made of a cured product of the curable composition, which is a film including quantum dots (B), be laminated with another functional layer. Hereinafter, the above-described film made of a cured product of the curable composition can be simply referred to as "quantum dot-containing film". It is preferred that a quantum dot-containing film include quantum dots producing red light by wavelength conversion of incident light from a light source, and quantum dots producing green light by wavelength conversion of incident light from a light source. In addition, blue light and white light can be typically used as a light source.

Examples of another functional layer include a diffusion layer to diffuse light rays, a low refractive index layer having a lower refractive index than that of a silicon-containing resin film or a silica film, a reflection layer to reflex part of incident light from a light source, a light guide plate to allow light emitted by a light source to enter a laminated body and the like. In addition, a gap may be provided in a laminated body as needed. The gap may be for example an air layer, and a layer of an inert gas such as nitrogen.

As the diffusion layer, various diffusion layers which have been conventionally used for various displays and optical devices can be used without particular limitation. Typical examples thereof include a film having a fine structure such as prism on the surface thereof, a film in which beads are scattered or embedded on the surface thereof, and a film including fine particles and e.g. an interface or a gap structured to scatter light rays in the inside thereof.

The low refractive index layer is not particularly limited as long as it is a film having a lower refractive index than that of the above-described silicon-containing resin film and the above-described silica film, and films made of various materials can be used.

Examples of the reflection layer include a reflective polarizing film, a film having a fine structure such as prism on the surface thereof to reflect part of incident light, a metallic foil, a multilayer optical film and the like. The reflection layer reflects preferably 30% or more of incident light, more preferably 40% or more and particularly preferably 50% or more. It is preferred that the reflection layer be provided so that light having passed through a quantum dot-containing film is reflected and reflected light is allowed to enter the quantum dot-containing film again. The color purity of green light and red light emitted from a quantum dot-containing film can be increased by reflecting light incident from a reflection layer to a quantum dot-containing film in the direction of the reflection layer again by e.g. a diffusion layer compared to a case where a reflection layer is not used.

As the light guide plate, various light guide plates which have been conventionally used for various displays and optical devices can be used without particular limitation.

Typical examples of preferred layer constitution of the laminated body including a quantum dot-containing film and another functional layer include layer constitution in the following 1) to 8). It should be noted that in laminated bodies having the constitution in 1) to 8), light rays emitted from a light source are allowed to enter the layer described on the leftmost end, and light rays after wavelength conversion by a quantum dot-containing film are extracted from the layer described on the rightmost end. A display panel is commonly provided so that light rays extracted from a laminated body are allowed to enter, and red light, green light and blue light having high color purity are used to show an image.

1) Diffusion layer/quantum dot-containing film/low refractive index layer/reflection layer,
2) light guide plate/diffusion layer/quantum dot-containing film/low refractive index layer/reflection layer,
3) low refractive index layer/quantum dot-containing film/gap/reflection layer,
4) light guide plate/low refractive index layer/quantum dot-containing film/gap/reflection layer,
5) low refractive index layer/quantum dot-containing film/low refractive index layer/reflection layer,
6) light guide plate/low refractive index layer/quantum dot-containing film/low refractive index layer/reflection layer,
7) reflection layer/low refractive index layer/quantum dot-containing film/low refractive index layer/reflection layer, and
8) light guide plate/reflection layer/low refractive index layer/quantum dot-containing film/low refractive index layer/reflection layer.

It should be noted that in laminated bodies described above, the above-described film made of a cured product of the curable composition (quantum dot-containing film) is preferably produced in accordance with the above-described method.

<<Light-Emitting Display Element Panel and Light-Emitting Display>>

The above-described film made of a cured product of the curable composition and the above-described laminated body are incorporated into various light-emitting display element panels, and are preferably used to extract red light, green light and blue light having high color purity from light rays emitted from a light source. Here, "quantum dot sheet" is a general term for the above-described film made of a cured product of the curable composition and the above-described laminated body.

The light-emitting display element panel typically includes the combination of a backlight as a light source, a quantum dot sheet and a display panel. When the quantum dot sheet is equipped with a light guide plate, a light source is typically provided so that light rays are allowed to enter the lateral side of the light guide plate. The light rays having entered from the lateral side of the light guide plate pass through the quantum dot sheet and enter the display panel. When the quantum dot sheet is not equipped with a light guide plate, light rays from a surface light source are allowed to enter the main surface of the quantum dot sheet, and light rays having passed through the quantum dot sheet are allowed to enter the display panel. The type of display panel is not particularly limited as long as an image can be formed using light rays having passed through a quantum dot sheet, and the type is typically a liquid crystal display panel.

Because red light, green light and blue light having particularly high color purity are easily extracted from light rays emitted from a light source, the quantum dot sheet is preferably the above-described laminated body. When the quantum dot sheet is a laminated body, preferred combinations of constitution of a light-emitting display element panel include the following a) to h) combinations. In the combinations described in a) to h) below, laminating is carried out from the constitution described on the leftmost end in the order described to form a light-emitting display element panel.

a) Surface light source/diffusion layer/quantum dot sheet/low refractive index layer/reflection layer/display panel,
b) light guide plate with light source/diffusion layer/quantum dot sheet/low refractive index layer/reflection layer/display panel,
c) surface light source/low refractive index layer/quantum dot sheet/gap/reflection layer/display panel,
d) light guide plate with light source/low refractive index layer/quantum dot sheet/gap/reflection layer/display panel,
e) surface light source/low refractive index layer/quantum dot sheet/low refractive index layer/reflection layer/display panel,
f) light guide plate with light source/low refractive index layer/quantum dot sheet/low refractive index layer/reflection layer/display panel,
g) surface light source/reflection layer/low refractive index layer/quantum dot sheet/low refractive index layer/reflection layer/display panel, and
h) light guide plate with light source/reflection layer/low refractive index layer/quantum dot sheet/low refractive index layer/reflection layer/display panel.

By using the light-emitting display element panel described above, a light-emitting display, which has a wide range of hue reproduction and can show a clear image with good hues, can be produced.

EXAMPLES

The present invention will now be described in more detail by way of Examples. It should be noted, but the scope of the present invention is not limited to these Examples.

Examples 1 to 13, and Comparative Example 1

In Examples and Comparative Example, the following A-1 to A-5 were used as an epoxy compound (A) (component (A)):
A-1: 1,3,5-trisglycidylisocyanuric acid,
A-2: 4,4'-bis(1,2-epoxycyclohexane),
A-3: bisphenol A epoxy resin,
A-4: ethylene glycol diglycidyl ether, and
A-5: 3,4-epoxycyclohexylmethyl 3',4'-epoxycyclohexane carboxylate.

In Examples and Comparative Example, the following B-1 to B-4 were used as quantum dots (B) (component (B)). B-1 and B-2 were used as a dispersion liquid in which quantum dots are dispersed in propyleneglycol monomethylether acetate (PGMEA) in a concentration of 3% by mass. B-3 and B-4 were used as a dispersion liquid in which quantum dots are dispersed in PGMEA in a concentration of 1% by mass.
B-1: quantum dots in which oleyl amine is coordinated to particles in which cores including InP are covered with a shell layer including ZnS (emission maximum 530 nm),
B-2: quantum dots in which oleyl amine is coordinated to particles in which cores including InP are covered with a shell layer including ZnS (emission maximum 620 nm),
B-3: quantum dots in which cores including CdSe are covered with a shell layer including ZnS (emission maximum: 520 nm), and
B-4: quantum dots in which cores including CdSe are covered with a shell layer including ZnS (emission maximum: 630 nm).

In Examples and Comparative Example, the following C-1 to C-3 were used as an acid generator (C) (component (C)).

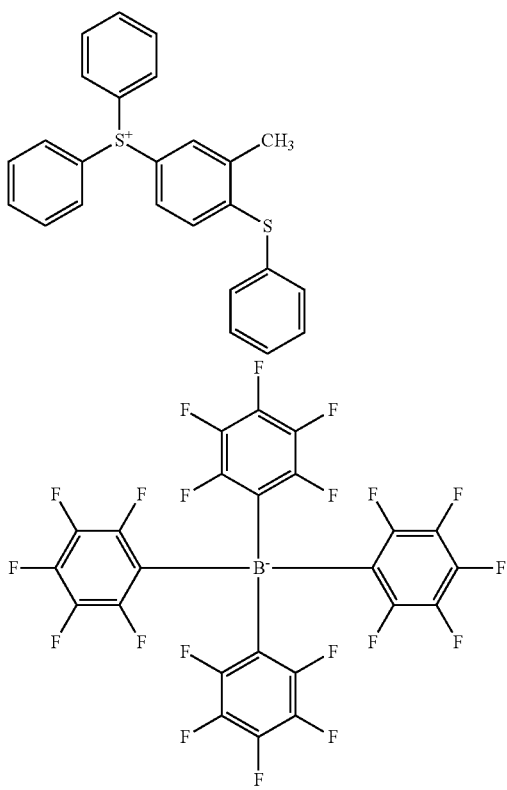

C-1

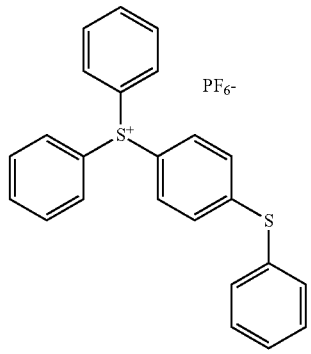

C-2

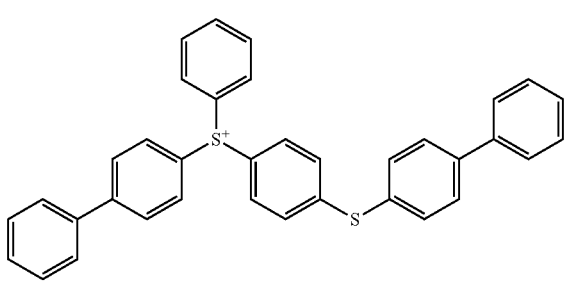

C-3

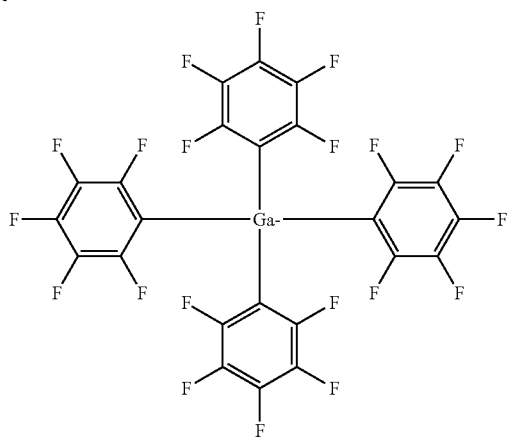

In Examples and Comparative Example, 3-glycidoxypropyl trimethoxysilane (KBM-403 manufactured by Shin-Etsu Silicones) was used as a silane coupling agent.

The type and amount of epoxy compound (A) and acid generator (C) described in Table 1, and the type in Table 1 and the type and amount of quantum dot dispersion liquid including quantum dots (B) described in Table 1 were uniformly mixed to obtain a curable composition in each of Examples and Comparative Example.

Using the obtained curable compositions, fluorescence efficiency was evaluated in accordance with the following method. The evaluation results are shown in Table 1.

<Evaluation of Fluorescence Efficiency>

To the quantum dot (B) dispersion liquid used to prepare a curable composition, toluene was added so that absorbance at a wavelength of 450 nm would be 0.4 to produce a diluted dispersion liquid. The quantum yields of the obtained diluted dispersion liquid and a cured film formed in the following conditions at an excitation wavelength of 450 nm each were measured by a quantum yield spectrometer (C9920-02G manufactured by Hamamatsu Photonics K.K.). The quantum yield of a diluted dispersion liquid is used as Q1, and the quantum yield of a cured film is used as Q2. The quantum yield was calculated by the following formula:

Quantum yield ratio (%)=(Q2/Q1)×100.

Fluorescence efficiency was evaluated based on the calculated quantum yield ratio in accordance with the following standards.
(Conditions of Forming Cured Film)
The obtained composition was spin-coated, dried in the conditions of 70'C for 2 minutes, and cured by light exposure at an exposure amount of 100 mJ using broadband light. As described above, a cured film with a thickness of 1 μm was obtained.
(Standards to Determine Fluorescence Efficiency)
A: the quantum yield ratio is 70% or more,
B: the quantum yield ratio is 50% or more and less than 70%,
C: the quantum yield ratio is 0.1% or more and less than 50%, and
D: the quantum yield ratio is less than 0.1%.

TABLE 1

| | Component (A) Type (Parts by mass) | Component (B) Type (Parts by mass) | Component (C) Type (Parts by mass) | Silane coupling agent (Parts by mass) | Evaluation (Fluorescence efficiency) |
|---|---|---|---|---|---|
| Ex. 1 | A-1(90) | B-1(7) | C-1(2) | (1) | A |
| Ex. 2 | A-2(90) | B-1(7) | C-1(2) | (1) | A |
| Ex. 3 | A-3(90) | B-1(7) | C-1(2) | (1) | C |
| Ex. 4 | A-1(90) | B-2(7) | C-1(2) | (1) | A |
| Ex. 5 | A-2(90) | B-2(7) | C-1(2) | (1) | A |
| Ex. 6 | A-1(90) | B-3(7) | C-1(2) | (1) | A |
| Ex. 7 | A-2(90) | B-3(7) | C-1(2) | (1) | A |
| Ex. 8 | A-1(90) | B-1(5) B-2(2) | C-1(2) | (1) | A |
| Ex. 9 | A-2(90) | B-1(5) B-2(2) | C-1(2) | (1) | A |
| Ex. 10 | A-1(90) | B-3(5) B-4(2) | C-1(2) | (1) | A |
| Ex. 11 | A-2(90) | B-3(5) B-4(2) | C-1(2) | (1) | A |
| Ex. 12 | A-1(90) | B-1(7) | C-2(2) | (1) | B |
| Ex. 13 | A-2(90) | B-1(7) | C-2(2) | (1) | B |
| Ex. 14 | A-1(90) | B-1(7) | C-3(2) | (1) | A |
| Ex. 15 | A-1(90) | B-2(7) | C-3(2) | (1) | A |
| Ex. 16 | A-2(90) | B-1(7) | C-3(2) | (1) | A |
| Ex. 17 | A-2(90) | B-2(7) | C-3(2) | (1) | A |
| Ex. 18 | A-5(90) | B-1(7) | C-3(2) | (1) | A |
| Ex. 19 | A-5(90) | B-2(7) | C-3(2) | (1) | A |
| Comp. Ex. 1 | A-4(90) | B-1(7) | C-1(2) | (1) | D |

According to Table 1, it is found that, when an epoxy compound (A) having two or more epoxy groups and including a cyclic structure other than an oxirane ring is cured using an acid generator (C) in the curable composition including quantum dots (B), a cured film with good fluorescence efficiency can be formed. In Comparative Example 1, contrarily, because ethyleneglycol diglycidylether not including a cyclic structure was used as an epoxy compound (A), a cured film with good fluorescence efficiency could not be formed.

What is claimed is:
1. A curable composition, comprising an epoxy compound (A), quantum dots (B) and an acid generator (C), wherein the epoxy compound (A) has two or more epoxy groups, and comprises a cyclic structure other than an oxirane ring, wherein the quantum dots (B) comprise at least one core-shell type selected from the group consisting of InP/ZnS, InP/ZnSSe, CuInS$_2$/ZnS, and ZnS-AgInS$_2$ solid solution/ZnS, wherein the epoxy compound (A) comprises compounds selected from the group consisting of compounds represented by the following formulae (a1), (a1-1), (a1-2), (a1-3), (a1- 4), (a1-5) and (a1-7):

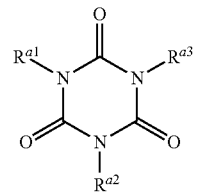

(a1)

in the formula (a1), $R^{a1}$, $R^{a2}$ and $R^{a3}$ are each independently a hydrogen atom or an organic group optionally comprising an epoxy group, and the total number of epoxy groups of $R^{a1}$, $R^{a2}$ and $R^{a3}$ is 2 or more;

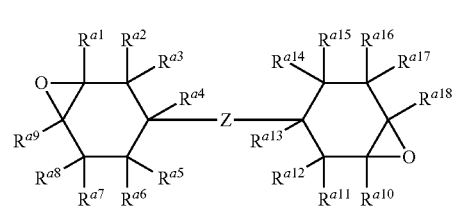

(a1-1)

in the formula (a1-1), Z represents a single bond or a linking group which is a divalent group having one or more atoms, the linking group Z includes a divalent group selected form the group consisting of —O—, —O—CO—, —S—, —SO—, —SO$_2$—, —CBr$_2$—, —C(CBr$_3$)$_2$—, —C(CF$_3$)$_2$—, and a group formed by bonding a plural of these divalent groups, $R^{a1}$ to $R^{a18}$ are each independently a group selected from the group consisting of a hydrogen atom, a halogen atom and an organic group;

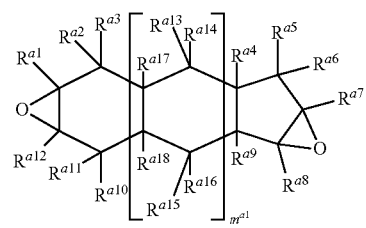

(a1-2)

in the formula (a1-2), $R^{a1}$ to $R^{a18}$ are a group selected from the group consisting of a hydrogen atom, a halogen atom and an organic group, $R^{a2}$ and $R^{a10}$ may be bonded to each other, $R^{a13}$ and $R^{a16}$ may be bonded to each other to form a ring, $m^{a1}$ is 0 or 1;

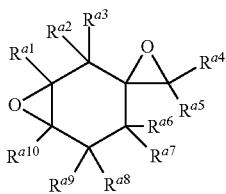
(a1-3)

in the formula (a1-3), $R^{a1}$ to $R^{a10}$ are a group selected from the group consisting of a hydrogen atom, a halogen atom and an organic group, $R^{a2}$ to $R^{a8}$ may be bonded to each other;

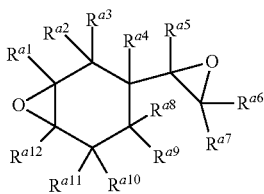
(a1-4)

in the formula (a1-4), $R^{a1}$ to $R^{a12}$ are a group selected from the group consisting of a hydrogen atom, a halogen atom and an organic group, $R^{a2}$ and $R^{a10}$ may be bonded to each other;

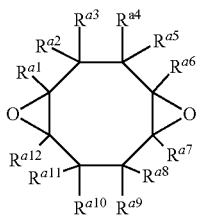
(a1-5)

in the formula (a1-5), $R^{a1}$ to $R^{a12}$ are a group selected from the group consisting of a hydrogen atom, a halogen atom and an organic group, wherein in the formulae (a1-1) to (a1-5), when $R^{a1}$ to $R^{a18}$ are an organic group, the organic group may be a hydrocarbon group, or a group including a carbon atom and a halogen atom, or a group including a halogen atom and a heteroatom comprising an oxygen atom, a sulfur atom, a nitrogen atom or a silicon atom, together with a carbon atom and a hydrogen atom, the halogen atom is selected from the group consisting of a chlorine atom, a bromine atom, an iodine atom and a fluorine atom; and

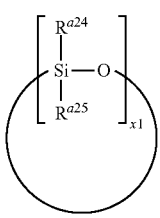
(a1-7)

in the formula (a1-7), $R^{a24}$ and $R^{a25}$ represent a monovalent group including an epoxy group, or an alkyl group, at least two of the x1 number of $R^{a24}$ and the x1 number of $R^{a25}$ in the compound represented by the formula (a1-7) are a monovalent group including an epoxy group, x1 in the formula (a1-7) represents an integer of 3 or more, $R^{a24}$ and $R^{a25}$ in the compound represented by the formula (a1-7) may be the same or different, a plurality of $R^{a24}$ may be the same or different, a plurality of $R^{a25}$ may be the same or different, wherein the quantum dots (B) are surface-modified, and wherein an average particle size of the quantum dots (B) is 0.5 nm or more and 15 nm or less.

2. The curable composition according to claim 1, wherein the acid generator (C) comprises a sulfonium salt.

3. The curable composition according to claim 2, comprising as the sulfonium salt a sulfonium salt represented by the following formula (c1):

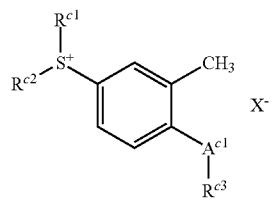
(c1)

in the formula (c1), $R^{c1}$ and $R^{c2}$ independently represent an alkyl group optionally substituted with a halogen atom or a group represented by the following formula (c2):

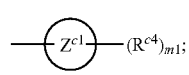
(c2)

$R^{c1}$ and $R^{c2}$ are optionally bonded to each other to form a ring together with the sulfur atom in the formula; $R^{c3}$ represents a group represented by the following formula (c3):

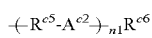
(c3)

or a group represented by the following formula (c4):

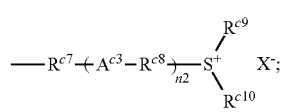
(c4)

$A^{c1}$ represents S, O or Se; $X^-$ represents a monovalent anion; with the proviso that $R^{c1}$ and $R^{c2}$ are not simultaneously an alkyl group optionally substituted with a halogen atom, in the formula (c2), a ring $Z^{c1}$ represents an aromatic hydrocarbon ring; $R^{c4}$ represents an alkyl group optionally substituted with a halogen atom, a hydroxy group, an alkoxy group, an alkylcarbonyl group, an alkoxycarbonyl group, an acyloxy group, an alkylthio group, a thienyl group, a thienylcarbonyl group, a furanyl group, a furanylcarbonyl group, a selenophenyl group, a selenophenylcarbonyl group, a heterocyclic aliphatic hydrocarbon group, an alkylsulfinyl group, an alkylsulfonyl group, a hydroxy(poly)alkyleneoxy group, an optionally substituted amino group, a cyano group, a nitro group or a halogen atom; and m1 represents an integer of 0 or more, in the formula (c3), $R^{c5}$ represents an alkylene group optionally substituted with a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group or a halogen atom, or a group represented by the following formula (c5):

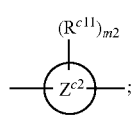

$R^{c6}$ represents an alkyl group optionally substituted with a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group or a halogen atom, or a group represented by the following formula (c6):

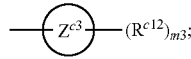

$A^{c2}$ represents a single bond, S, O, a sulfinyl group or a carbonyl group; and n1 represents 0 or 1, in the formula (c4), $R^{c7}$ and $R^{c8}$ independently represent an alkylene group optionally substituted with a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group or a halogen atom, or a group represented by the formula (c5); $R^{c9}$ and $R^{c10}$ independently represent an alkyl group optionally substituted with a halogen atom or a group represented by the formula (c2); $R^{c9}$ and $R^{c10}$ are optionally bonded to each other to form a ring together with the sulfur atom in the formula; $A^{c3}$ represents a single bond, S, O, a sulfinyl group or a carbonyl group; $X^-$ is the same as defined above; n2 represents 0 or 1; with the proviso that $R^{c9}$ and $R^{c10}$ are not simultaneously an alkyl group optionally substituted with a halogen atom, in the formula (c5), a ring $Z^{c2}$ represents an aromatic hydrocarbon ring; $R^{c11}$ represents an alkyl group optionally substituted with a halogen atom, a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group or a halogen atom; and m2 represents an integer of 0 or more, in the formula (c6), a ring $Z^{c3}$ represents an aromatic hydrocarbon ring; $R^{c12}$ represents an alkyl group optionally substituted with a halogen atom, a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, a thienylcarbonyl group, a furanylcarbonyl group, a selenophenylcarbonyl group, an aryl group, a heterocyclic group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group or a halogen atom; and m3 represents an integer of 0 or more.

4. The curable composition according to claim 3, wherein the monovalent anion represented by the $X^-$ is a boron-containing anion represented by the following formula:

wherein, $R^{x1}$ represents a phenyl group in which at least part of hydrogen atoms are substituted with a halogen atom or an electron withdrawing group, and Y represents a halogen atom, and c represents an integer from 1 to 4.

5. The curable composition according to claim 3, wherein a cation portion of the sulfonium salt represented by the formula (c1) is a cation portion represented by the following formula:

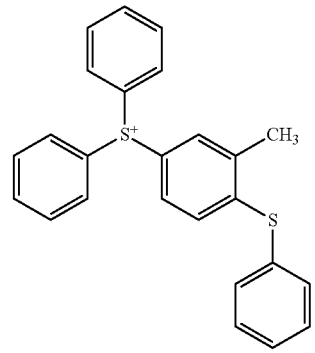

6. A film comprising a cured product of the curable composition according to claim 1.

7. An optical film for a light-emitting display element, comprising the film according to claim 6.

8. A light-emitting display element panel, comprising the optical film for a light-emitting display element according to claim 7.

9. A light-emitting display equipped with the light-emitting display element panel according to claim 8.

10. The curable composition according to claim 1, wherein the compound represented by the formula (a1-2) is a compound represented by the following formula (a1-2-1):

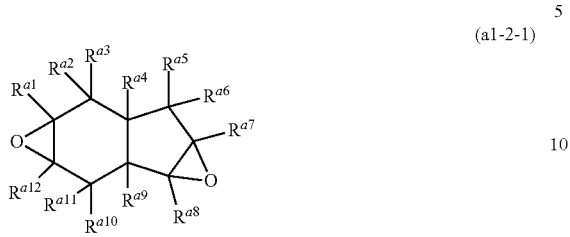

(a1-2-1)

in the formula (a1-2-1), $R^{a1}$ to $R^{a12}$ are a group selected from the group consisting of a hydrogen atom, a halogen atom and an organic group, $R^{a2}$ and $R^{a10}$ may be bonded to each other to form a ring.

11. The curable composition according to claim 1, wherein an average thickness of a shell of the quantum dots (B) is 0.4 nm or more and 2 nm or less.

* * * * *